(12) United States Patent
Heo et al.

(10) Patent No.: US 9,899,460 B2
(45) Date of Patent: Feb. 20, 2018

(54) ORGANIC LIGHT EMITTING DISPLAY DEVICE

(71) Applicant: LG DISPLAY CO., LTD., Seoul (KR)

(72) Inventors: JoonYoung Heo, Seoul (KR); YoungMi Kim, Incheon (KR); YongMin Park, Paju-si (KR); Yoonseob Jeong, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/199,048

(22) Filed: Jun. 30, 2016

(65) Prior Publication Data

US 2017/0005153 A1 Jan. 5, 2017

(30) Foreign Application Priority Data

Jun. 30, 2015 (KR) .................. 10-2015-0093689
Oct. 26, 2015 (KR) .................. 10-2015-0148681

(51) Int. Cl.
*H01L 29/08* (2006.01)
*H01L 27/32* (2006.01)
*H01L 51/52* (2006.01)
*H01L 51/56* (2006.01)

(52) U.S. Cl.
CPC ...... *H01L 27/3248* (2013.01); *H01L 27/3246* (2013.01); *H01L 27/3272* (2013.01); *H01L 27/3276* (2013.01); *H01L 51/5209* (2013.01); *H01L 51/56* (2013.01); *H01L 2227/323* (2013.01); *H01L 2251/568* (2013.01)

(58) Field of Classification Search
CPC ............ H01L 27/3248; H01L 27/3246; H01L 27/3272; H01L 27/3276; H01L 51/5209; H01L 51/56; H01L 2227/323; H01L 2251/568
USPC ......................................... 257/40
See application file for complete search history.

(56) References Cited

U.S. PATENT DOCUMENTS

| | | | |
|---|---|---|---|
| 2005/0269962 A1 | 12/2005 | Matsunaga | |
| 2005/0285512 A1 | 12/2005 | Murayama | |
| 2007/0145892 A1* | 6/2007 | Chen | H01L 51/5271 313/506 |
| 2007/0201056 A1* | 8/2007 | Cok | B82Y 20/00 358/1.9 |
| 2009/0009069 A1* | 1/2009 | Takata | H01L 27/3246 313/504 |
| 2009/0015153 A1* | 1/2009 | Asano | H01L 51/5237 313/504 |

(Continued)

FOREIGN PATENT DOCUMENTS

| CN | 104733500 A | 6/2015 |
|---|---|---|
| EP | 2157610 A1 | 2/2010 |

(Continued)

*Primary Examiner* — Dzung Tran
(74) *Attorney, Agent, or Firm* — Birch, Stewart, Kolasch & Birch, LLP

(57) ABSTRACT

Discussed is an organic light emitting display device that can include a bank that defines the periphery of an emission area; a structure disposed on the bank; a first electrode disposed in the emission area; an organic layer disposed on the bank, the structure, and the first electrode, an organic layer disposed on the structure being separated from other organic layers; and a second electrode disposed on the organic layer.

18 Claims, 31 Drawing Sheets

(56) References Cited

U.S. PATENT DOCUMENTS

| | | | |
|---|---|---|---|
| 2009/0278450 A1* | 11/2009 | Sonoyama | H01L 27/322 313/504 |
| 2012/0228603 A1* | 9/2012 | Nakamura | H01L 27/322 257/40 |
| 2013/0299791 A1 | 11/2013 | Hirakata et al. | |
| 2014/0035456 A1 | 2/2014 | Isa | |
| 2014/0183479 A1 | 7/2014 | Park et al. | |
| 2015/0097171 A1 | 4/2015 | Kim et al. | |

FOREIGN PATENT DOCUMENTS

| | | |
|---|---|---|
| TW | I488542 B | 6/2015 |
| WO | 02/41400 A1 | 5/2002 |

* cited by examiner

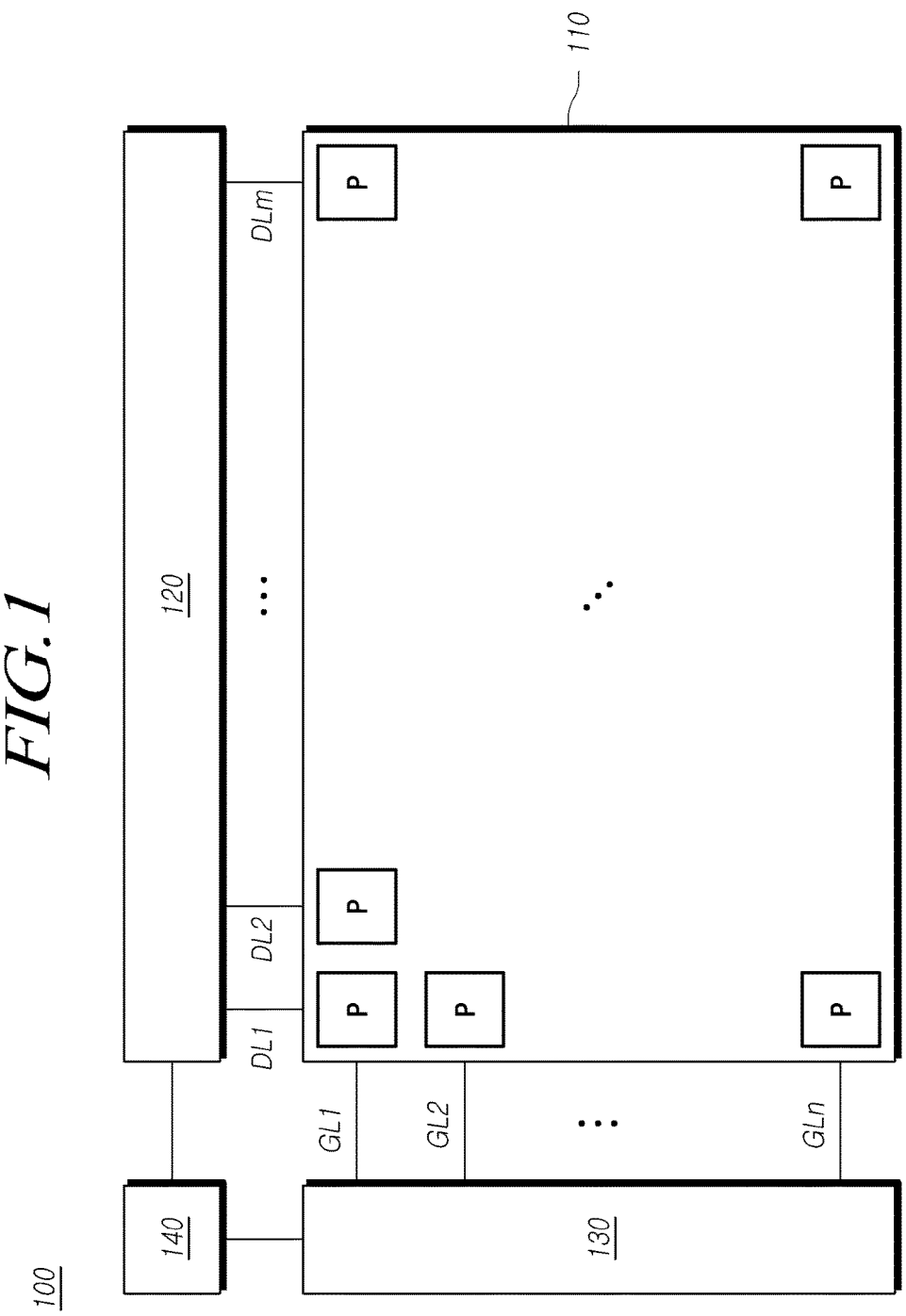

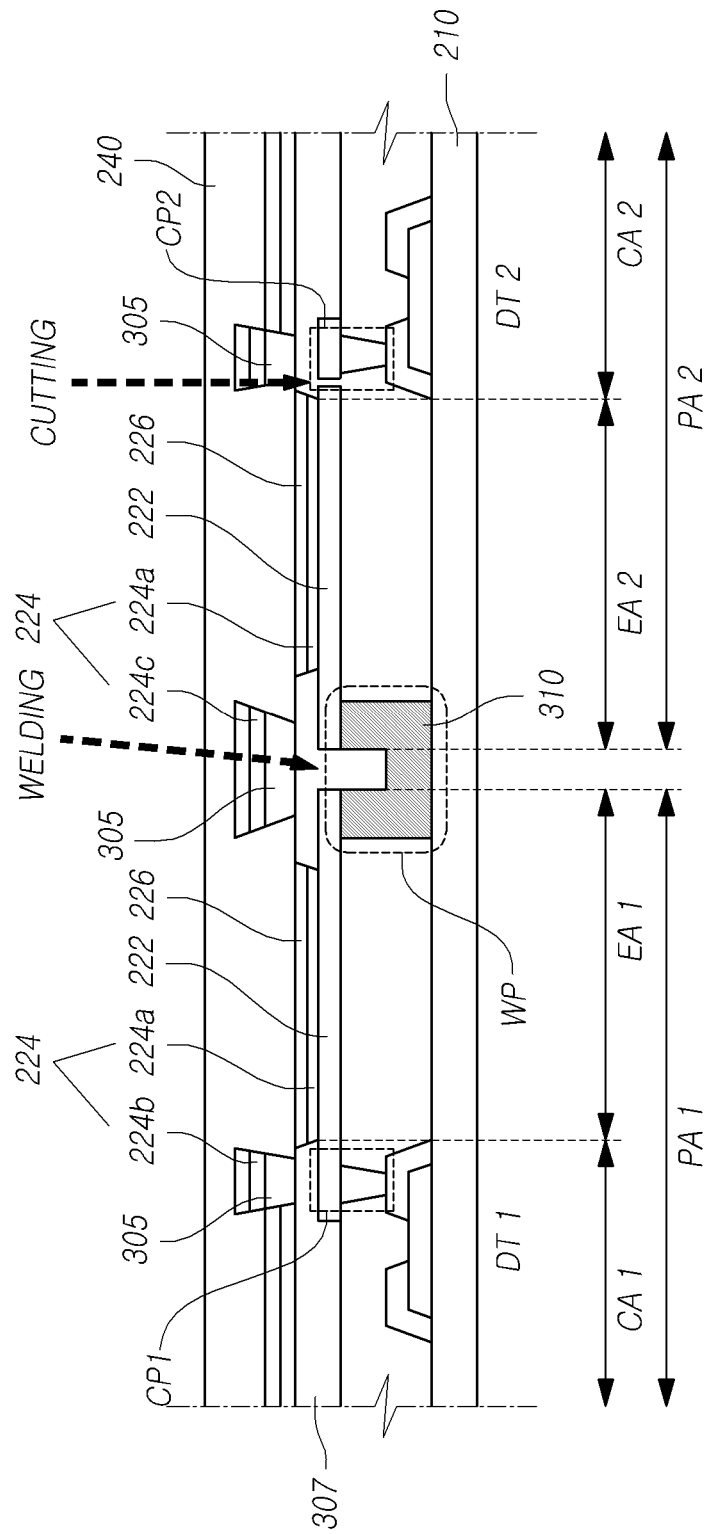

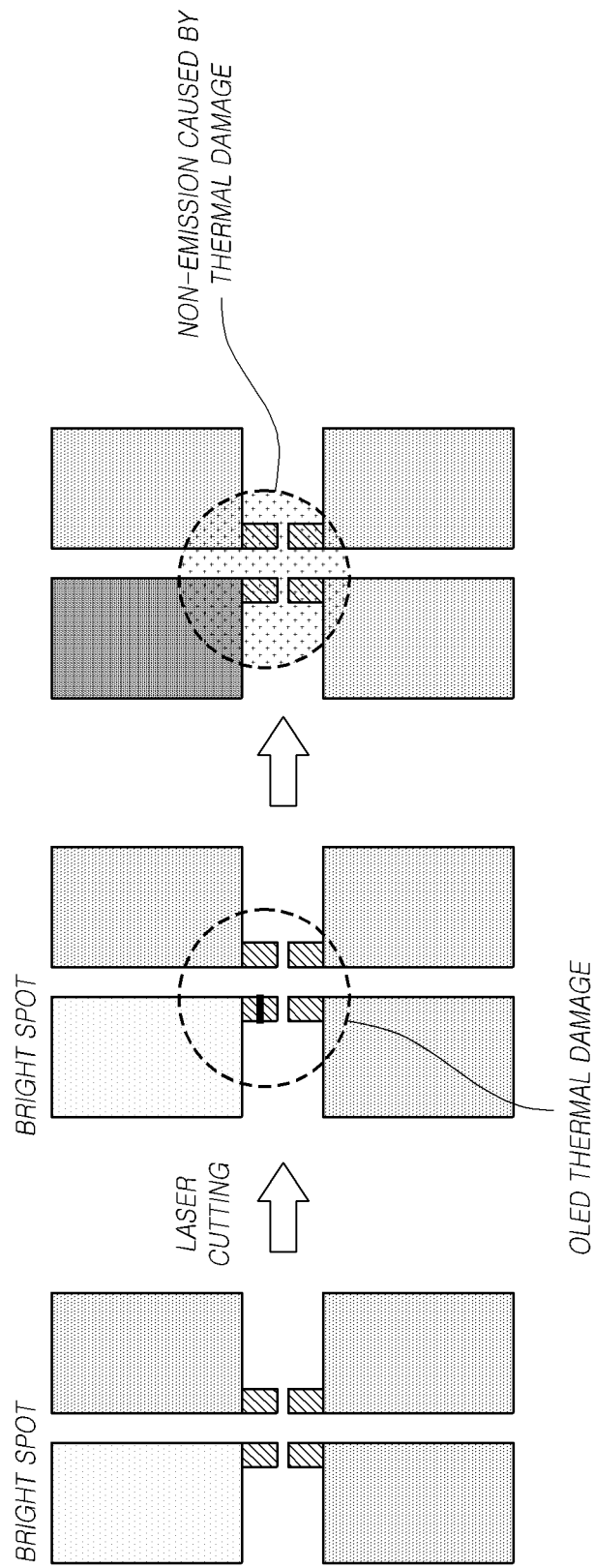

ORGANIC LIGHT EMITTING DISPLAY DEVICE

CROSS-REFERENCE TO RELATED APPLICATIONS

This application claims priority from Korean Patent Application No. 10-2015-0148681 filed on Oct. 26, 2015, and Korean Patent Application No. 10-2015-0093689 filed on Jun. 30, 2015, which are all hereby incorporated by reference for all purposes as if fully set forth herein

BACKGROUND OF THE INVENTION

Field of the Invention

The present invention relates to an organic light emitting display device that displays an image.

Description of the Related Art

An organic light emitting display device which has recently attracted attention as a display device uses a self-emitting organic light emitting diode (OLED). Thus, the organic light emitting display device has advantages of a high response speed, a high light emitting efficiency, a high brightness, and a wide viewing angle.

In the organic light emitting display device, pixels including the OLED are aligned in a matrix form, and the brightness of pixels selected in response to a scan signal is controlled depending on a gray scale of data.

Each pixel in the organic light emitting display device has a pixel structure in which the OLED and a driving circuit for driving the OLED are disposed.

In order to manufacture a display panel in which a plurality of pixels having the pixel structure is defined, so many processes need to be performed. During the processes, process-induced foreign material(s) may be generated in a pixel. In this case, the pixel may become a defective pixel to be seen as a bright spot or a dark spot.

Such a pixel defect may cause deterioration of image quality. In severe cases, the display panel itself needs to be discarded.

Accordingly, a method for efficiently repairing a pixel defect is needed.

SUMMARY OF THE INVENTION

An aspect of the present invention provides an organic light emitting display device including a repair structure capable of repairing a pixel defect and also provides an organic light emitting display device in which a pixel defect is repaired.

An aspect of the present example embodiments provides an organic light emitting display device in which thermal damage is not spread to an organic layer during a repair process, and, thus, non-emission or bonding of adjacent pixels caused by the thermal damage during the repair process may be suppressed.

An aspect of the present example embodiments provides an organic light emitting display device to which the above-described repair process can be performed even if a black bank is applied.

According to an aspect of the present invention, there is provided an organic light emitting display device including: a bank that defines a boarder of an emission area; a structure disposed on the bank; a first electrode disposed in the emission area; an organic layer disposed on the bank, the structure, and the first electrode; and a second electrode disposed on the organic layer.

According to another aspect of the present invention, there is provided an organic light emitting display device including: an insulation layer; a bank disposed on the insulation layer and configured to define a boarder of an emission area; a structure disposed on the insulation layer; a first electrode disposed in the emission area; an organic layer disposed on the bank, the structure, and the first electrode; and a second electrode disposed on the organic layer.

Herein, an organic layer disposed on the structure is separated from other organic layers.

According to an aspect of the present invention, it is possible to provide an organic light emitting display device including a repair structure capable of repairing a pixel defect and also possible to provide an organic light emitting display device in which a pixel defect is repaired.

Further, according to an aspect of the present invention, it is possible to provide an organic light emitting display device in which thermal damage is not spread to an organic layer during a repair process, and, thus, non-emission or bonding of adjacent pixels caused by the thermal damage during the repair process can be suppressed.

According to an aspect of the present invention, it is possible to provide an organic light emitting display device to which the above-described repair process can be performed even if a repair black bank is applied.

BRIEF DESCRIPTION OF THE DRAWINGS

The above and other aspects, features and other advantages of the present disclosure will be more clearly understood from the following detailed description taken in conjunction with the accompanying drawings, in which:

FIG. 1 is a diagram schematically illustrating a system of an organic light emitting display device according to an embodiment of the present invention.

FIGS. 6A and 6B are cross-sectional views of the organic light emitting display device 100 including the repair structure illustrated in FIG. 5A.

FIG. 11C is a view illustrating non-emission of adjacent pixels caused by thermal damage in the organic light emitting display device according to the comparative example.

DETAILED DESCRIPTION OF THE EMBODIMENTS

Figure 2A:
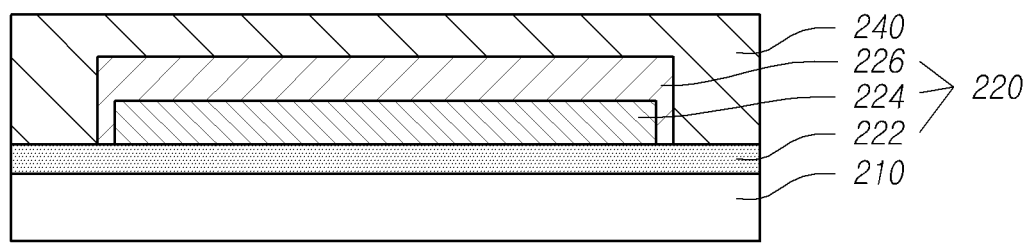
FIG. 2A is a cross-sectional view of an organic light emitting display device according to an embodiment of the present invention.

Hereinafter, some embodiments of the present disclosure will be described in detail with reference to the accompanying drawings. When reference numerals refer to components of each drawing, although the same components are illustrated in different drawings, the same components are referred to by the same reference numerals as possible. Further, if it is considered that description of related known configuration or function may cloud the gist of the present disclosure, the description thereof will be omitted.

Further, in describing components of the present disclosure, terminologies such as first, second, A, B, (a), (b), and the like may be used. The terminologies are used to distinguish one component from another component. However, a nature, an order, a sequence, or the number of components is not limited by the terminologies. If it is described that a component is "connected" or "coupled" to another component, it is understood that the component is directly connected or coupled to the other component but a component may be interposed between the components or the components may be "connected" or "coupled" through another component.

FIG. 1 is a diagram schematically illustrating a system of an organic light emitting display device according to an embodiment of the present invention.

Referring to FIG. 1, an organic light emitting display device 100 according to an embodiment of the present invention includes a display panel 110 including a plurality of pixels P disposed at intersections between a plurality of data lines DL1 to DLm formed in one direction and a plurality of gate lines GL1 to GLn formed in another direction and intersecting with the plurality of data lines DL1 to DLm. Further, the organic light emitting display device 100 includes a data driver 120 configured to supply a data voltage through the plurality of data lines DL1 to DLm, a gate driver 130 configured to supply a scan signal through the plurality of gate lines GL1 to GLn, and a timing controller 140 configured to control operation timings of the data driver 120 and the gate driver 130.

In each of the pixels P disposed on the display panel 110, an organic light emitting diode (OLED) and a driving circuit DRC for driving the OLED are disposed.

The driving circuit DRC disposed in each pixel basically includes a driving transistor DT configured to supply a current to the OLED, a switching transistor configured to apply a data voltage to a gate node of the driving transistor DT, and a storage capacitor configured to maintain a data voltage during one frame period. The driving circuit DRC may further include a sensing transistor configured to apply a reference voltage Vref to a source node (or drain node) of the driving transistor DT.

The timing controller 140 controls operation timings of the data driver 120 and the gate driver 130 and outputs various control signals for controlling the operation timings.

FIG. 2A is a cross-sectional view of an organic light emitting display device according to an embodiment of the present invention.

Referring to FIG. 2A, the organic light emitting display device 100 according to an embodiment of the present invention may be a top-emission organic light emitting display device that releases a light emitted from an organic light emitting diode 220 in a direction opposite to a substrate 210.

The organic light emitting display device 100 according to an embodiment of the present invention includes the organic light emitting diode (OLED) 220 that emits a light in each pixel area on the substrate 210. The OLED 220 may include a first electrode 222, a second electrode 226, and an organic layer 224 disposed between the first electrode 222 and the second electrode 226 in an emission area. The OLED 220 may emit lights of the same color, for example, white (W). Herein, in order to realize a color, the organic light emitting display device 100 may include a color filter in a direction in which a light is released to the outside. For example, in a top-emission organic light emitting display device, the color filter may be disposed on the OLED 220.

Further, the organic layer 224 of the OLED 220 may include first to third organic emission layers. The first organic emission layer may emit a blue (B) light, the second organic emission layer may emit any one of a green (G) light or a yellow green light, and the third organic emission layer may emit both a red (R) light and a blue (B) light.

The organic light emitting display device 100 may include an encapsulation layer 240 that seals the OLED 220. The encapsulation layer 240 may protect the OLED 220 from moisture, air, shock, and the like, provided from the outside.

Figure 2B:
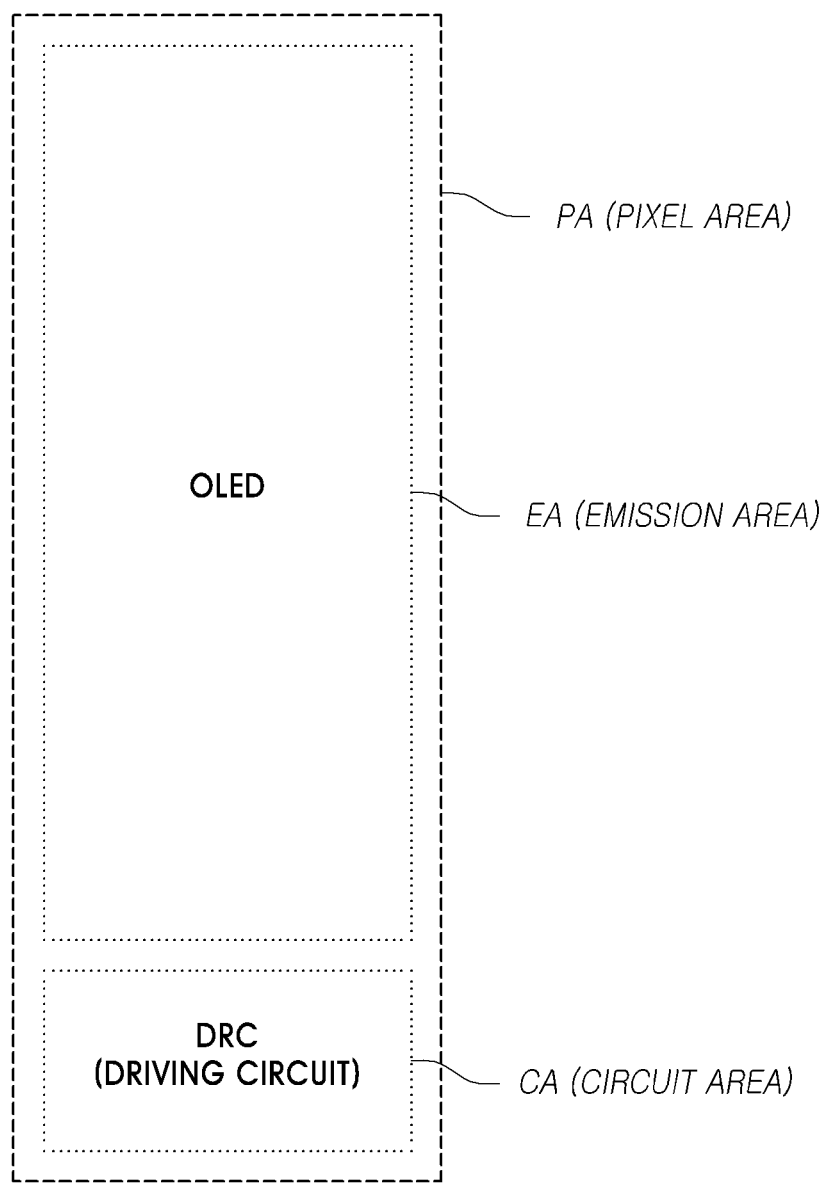
FIG. 2B is a diagram illustrating a basic pixel structure of an organic light emitting display device according to an embodiment of the present invention.

FIG. 2B is a view illustrating a basic pixel structure of the organic light emitting display device 100 according to an embodiment of the present invention.

Referring to FIG. 2B, a pixel area PA in each of the pixels P defined in the display panel 110 of the organic light emitting display device 100 according to an embodiment of the present invention may include an emission area EA through which a light is emitted from the OLED and a circuit area CA where the driving circuit DRC for driving the OLED is disposed. The circuit area CA may also be referred to as a non-emission area.

In the emission area EA, an emission unit including the OLED is disposed. In the circuit area CA, a circuit unit including the driving circuit DRC for driving the OLED is disposed.

Meanwhile, FIG. 2B illustrates the emission area EA and the circuit area CA as separate areas. However, such illustration is provided only for convenience in explanation. In some cases, the emission area EA and the circuit area CA may be overlapped with each other. For example, in the top-emission organic light emitting display device with reference to FIG. 2A, the circuit unit is disposed under the emission unit, so that the emission area EA and the circuit area CA may be overlapped with each other.

As described above, the driving circuit DRC disposed in each circuit area CA basically includes, for example, a driving transistor DT configured to supply a current to the OLED, a switching transistor (hereinafter, referred to as "second transistor T2") configured to apply a data voltage to a gate node of the driving transistor DT, and a storage capacitor Cstg configured to maintain a data voltage during one frame period. The driving circuit DRC may further include a sensing transistor (hereinafter, referred to as "first transistor T1") configured to apply a reference voltage Vref to a source node (or drain node) of the driving transistor DT.

That is, the driving circuit DRC disposed in each circuit area CA may include a 3T1C pixel structure including three transistors DT, T1 and T2 and one capacitor Cstg.

Figure 3:
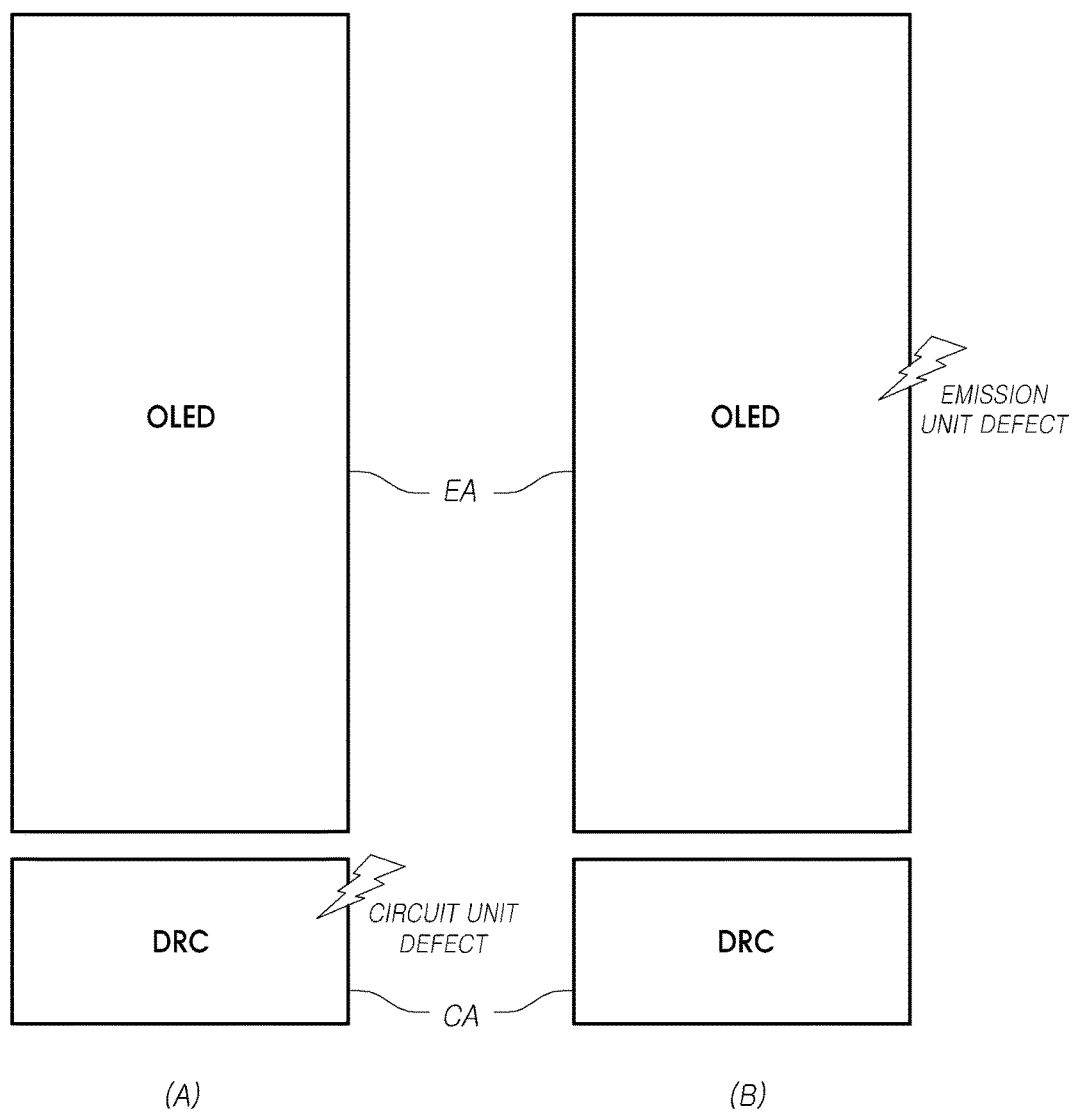
FIG. 3 is a diagram illustrating two types of pixel defect of an organic light emitting display device according to an embodiment of the present invention.

FIG. 3 is a view illustrating two types of pixel defect of an organic light emitting display device according to an embodiment of the present invention.

As described above, in the circuit area CA of each pixel area PA, the transistors DT, T1 and T2 and the capacitor Cstg are formed. Thus, a manufacturing process becomes complicated. Therefore, as illustrated in FIG. 3A, a defect may occur in the circuit area CA. Meanwhile, as illustrated in FIG. 3B, a defect may also occur in the emission area EA of each pixel area PA.

Such defects in the circuit area CA and the emission area EA are main factors to cause brightening or darkening of the corresponding pixel. Thus, the pixel becomes a defective pixel.

Figure 4:
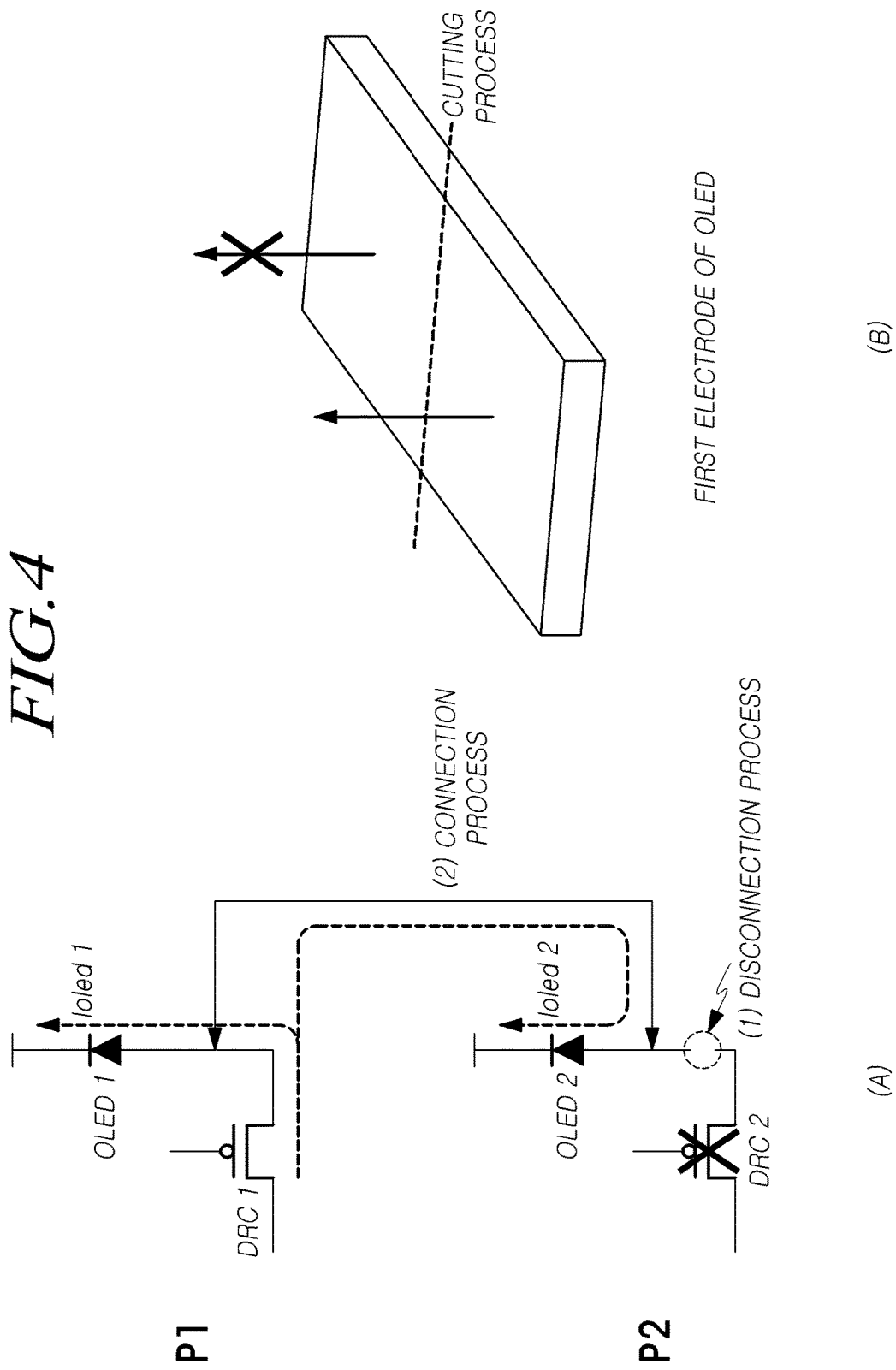
FIG. 4 is a conceptual diagram provided to explain a repair method for each type of pixel defect of an organic light emitting display device 100 according to an embodiment of the present invention.

FIG. 4 is a conceptual diagram provided to explain a repair method for each type of pixel defect of the organic light emitting display device 100 according to an embodiment of the present invention.

Referring to FIG. 4A, in a first pixel P1 and a second pixel P2 which are two pixels of a plurality of pixels disposed on the display panel 110, organic light emitting diodes OLED 1 and OLED 2 and driving circuits DRC 1 and DRC 2 are disposed respectively.

In FIG. 4A, one transistor illustrated as being connected to the organic light emitting diode OLED 1 of the first pixel P1 does not represent only a driving transistor DT of the first pixel P1 but represents the driving circuit DRC 1 of the first pixel P1.

Further, the first pixel P1 and the second pixel P2 may be same color pixels, or may be different color pixels in some cases.

Referring to FIG. 4A, if a defect occurs in a circuit unit of the driving circuit DRC 2 in the second pixel P2, repair of the circuit unit defect may include a disconnection process (for example: cutting process) of electrically disconnecting the driving circuit DRC 2 of the second pixel P2 where the circuit unit defect occurs from the organic light emitting diode OLED 2, and a connection process (for example: welding process) of electrically connecting the organic light emitting diode OLED 1 of the first pixel P1 to the organic light emitting diode OLED 2 of the second pixel P2 in order for the organic light emitting diode OLED 2 of the second pixel P2 to be supplied with a current from the driving circuit DRC 1 of the other pixel P1.

Thus, a current I1 output from the driving circuit DRC 1 of the first pixel P1 is divided to the organic light emitting diode OLED 1 of the first pixel P1 and the organic light emitting diode OLED 2 of the second pixel P2 and supplied in parallel (I1=Ioled1+Ioled2). That is, the organic light emitting diode OLED 1 of the first pixel P1 and the organic light emitting diode OLED 2 of the second pixel P2 share the driving circuit DRC 1 of the first pixel P1.

Referring to FIG. 4B, if an emission unit defect occurs in an organic light emitting diode OLED of any one pixel P, repair of the emission unit defect may include a "cutting process" of cutting a portion of the emission unit where the defect occurs due to a process-induced foreign material from a first electrode (for example: anode or cathode) of the organic light emitting diode OLED with the emission unit defect.

When the emission unit defect is repaired, the emission area EA in the pixel area PA of the corresponding pixel P may be decreased, which may cause a decrease in brightness of the corresponding pixel P. However, such a decrease in brightness may be internally or externally compensated by modifying a data voltage supplied to the corresponding pixel P. Thus, the decrease in brightness can be compensated.

As described above, in case of repairing a pixel defect (a circuit unit defect, an emission unit defect), for example, the cutting process and the welding process are used.

Therefore, in order to accurately and easily perform a repair process (the cutting process, the welding process) to the pixel defect without damaging a neighboring circuit or the like, a location for the cutting process and a location for the welding process need to be carefully determined.

In case of repairing a circuit unit defect, the location for the cutting process is a location for electrically disconnecting a driving circuit of the corresponding pixel where the circuit unit defect occurs from an organic light emitting diode. In case of repairing an emission unit defect, the location for the cutting process is a process for cutting an area or point where the emission unit defect occurs from a first electrode of an organic light emitting diode of the corresponding pixel. In the following, the location for the cutting process will be described as a cutting point CP.

The location for the welding process is a location for connecting a first electrode of an organic light emitting diode of the corresponding pixel where the circuit unit defect occurs to a first electrode of an organic light emitting diode of another pixel in parallel in order for the organic light emitting diode of the corresponding pixel where the circuit unit defect occurs to share a current output from a driving circuit of the other pixel with the organic light emitting diode of the other pixel. In the following, the location for the welding process will be described as a welding point WP.

The cutting point CP and the welding point WP may vary in location or number depending on a structure and alignment of pixels. In addition to the above-described locations, the cutting point CP may be any point for suppressing the supply of a current from a driving circuit of a pixel where a pixel defect occurs to an organic light emitting diode.

In addition to the exemplified location, the welding point WP may be any point for connecting a first electrode of an organic light emitting diode of a pixel where a circuit unit defect occurs to a first electrode of an organic light emitting diode of a pixel where a circuit unit defect does not occur. A specific pattern may be formed at each welding point WP of the display panel 110.

The specific pattern formed at each welding point WP of the display panel 110 is referred to as a floating pattern. The floating pattern keeps first electrodes of organic light emitting diodes in two pixels in an electrically disconnected state. In order to do so, the floating pattern may be insulated from at least one of the first electrodes of the organic light emitting diode in the two pixels.

Meanwhile, the floating pattern may be welded by a welding process such as laser welding, and then, a "connection pattern" for electrically connecting the first electrodes of the organic light emitting diode in the two pixels may be formed.

Figure 5A:
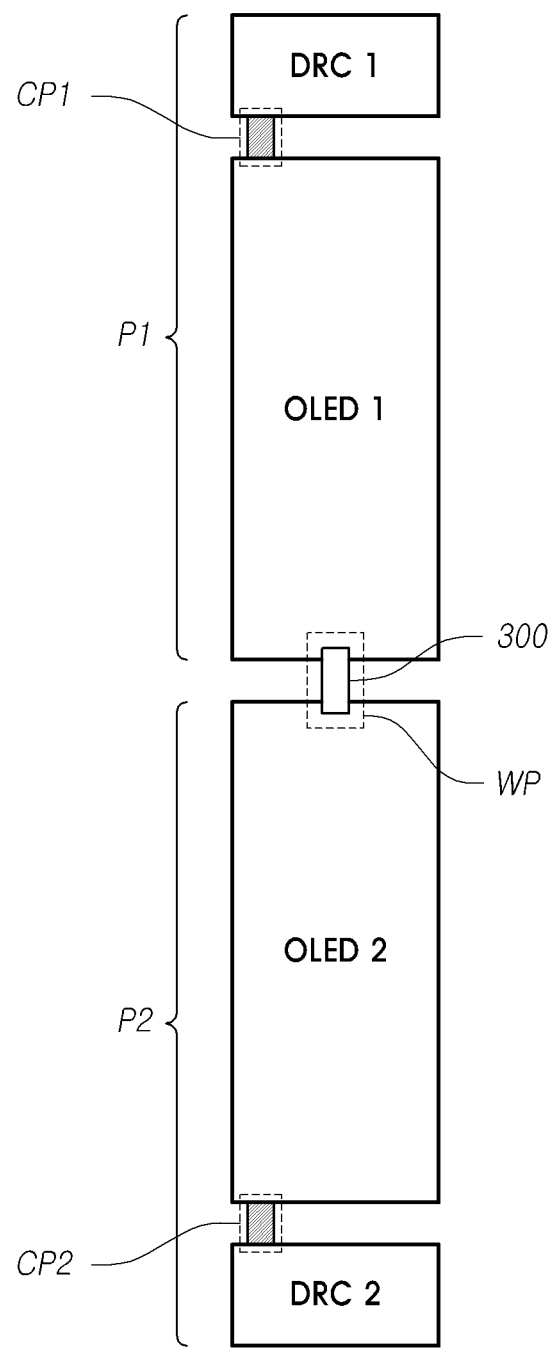
FIG. 5A is a plane view of an organic light emitting display device including a repair structure.

FIG. 5A is a plane view of an organic light emitting display device including a repair structure.

Referring to FIG. 5A, in the display panel 110 of the organic light emitting display device 100 including a repair structure, emission areas of the first pixel P1 and the second pixel P2 which are two pixels of a plurality of pixels may be disposed to be adjacent to each other. That is, the organic light emitting diode OLED 1 of the first pixel P1 and the organic light emitting diode OLED 2 of the second pixel P2 may be disposed to be adjacent to each other.

A floating pattern 300 to be welded during a repair process is formed at a welding point WP.

Further, the floating pattern 300 may be formed to be overlapped with the pixel area PA 1 of the first pixel P1 and the pixel area PA 2 of the second pixel P2 around a border between the pixel area PA 1 of the first pixel P1 and the pixel area PA 2 of the second pixel P2.

That is, in case of a pixel alignment type, the welding point WP for repairing a circuit unit defect may be overlapped with the emission area EA 1 in the pixel area PA 1 of the first pixel P1 and the emission area EA 2 in the pixel area PA 2 of the second pixel P2.

In each of the first pixel P1 and the second pixel P2, there may be a cutting point CP1 and CP2 for circuit disconnection between an organic light emitting diode and a driving circuit when a circuit unit defect occurs in the driving circuit.

In a circuit view, in case of repairing a circuit unit defect in the first pixel P1, a cutting point CP1 may be located at any point on a current supply path from the driving circuit DRC 1 of the first pixel P1 to the organic light emitting diode OLED 1. Further, in case of repairing a circuit unit defect in the second pixel P2, a cutting point CP2 may be located at any point on a current supply path from the driving circuit DRC 2 of the second pixel P2 to the organic light emitting diode OLED 2.

Figure 5B:
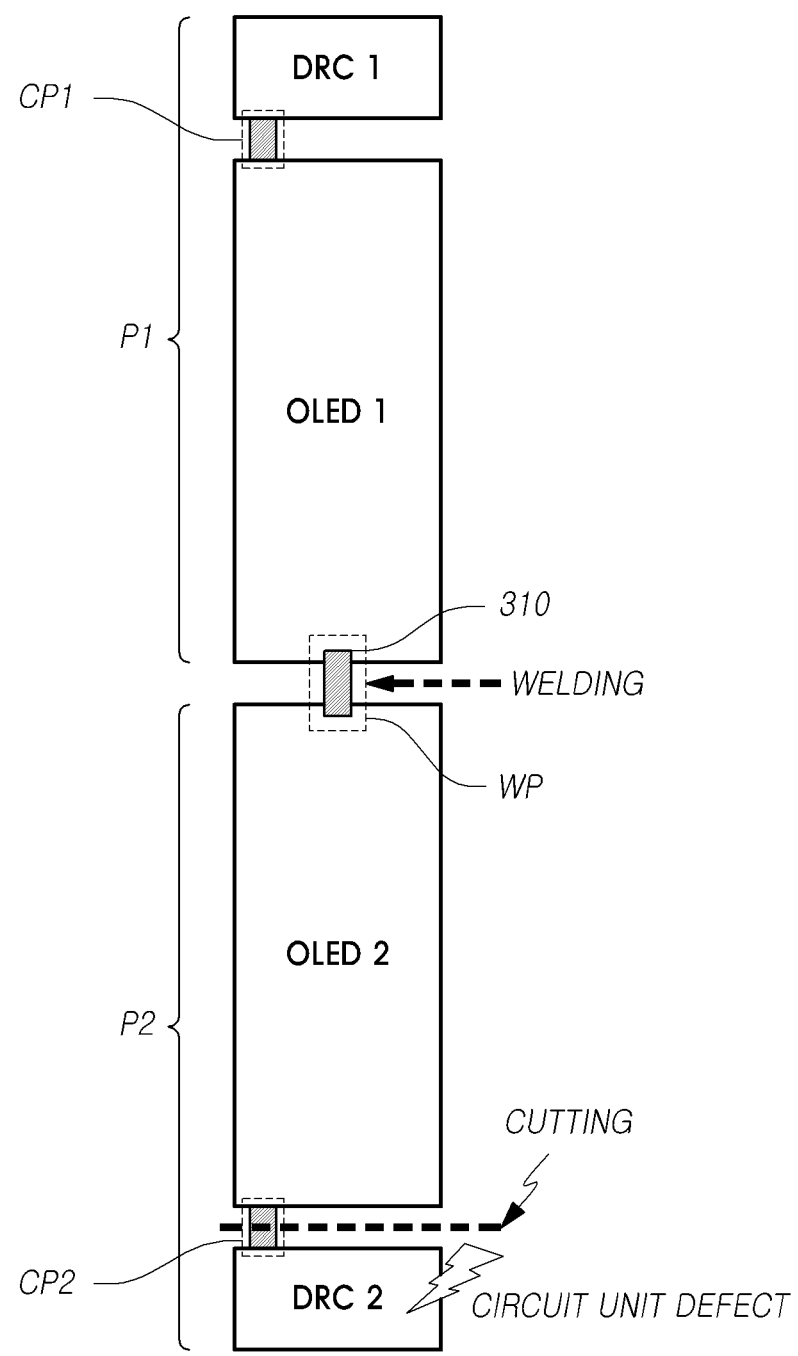
FIG. 5B is a plane view of the organic light emitting display device 100 including a repair structure after a repair process.

FIG. 5B is a plane view of the organic light emitting display device 100 including a repair structure after a repair process.

Referring to FIG. 5B, if a circuit unit defect occurs in the driving circuit DRC 2 of the second pixel P2, the organic light emitting diode OLED 2 of the second pixel P2 is disconnected from the driving circuit DRC 2 through a cutting process in order to repair the circuit unit defect in the second pixel P2.

The cutting point CP2 where the cutting process is performed may be located at a portion where the first electrode 222 of the organic light emitting diode OLED 2 of the second pixel P2 is extended to the circuit area CA 2.

By performing the cutting process at the cutting point CP2, the portion where first electrode 222 of the organic light emitting diode OLED 2 of the second pixel P2 is extended to the circuit area CA 2 is cut. Thus, the organic light emitting diode OLED 2 of the second pixel P2 is electrically disconnected from a transistor DT 2 in the driving circuit DRC 2.

Referring to FIG. 5B, in order to electrically connect the first electrode 222 of the organic light emitting diode OLED 2 of the second pixel P2 disconnected from the driving circuit DRC 2 of the second pixel P2 in a circuit manner to a first electrode 1010 of the organic light emitting diode OLED 1 of the first pixel P1, the welding process is performed to the floating pattern 300 formed at the welding point WP. Therefore, a connection pattern 310 formed by welding the floating pattern 300 may be located.

The connection pattern 310 connects the first electrode 222 of the organic light emitting diode OLED 2 of the second pixel P2 to the first electrode 1010 of the organic light emitting diode OLED 1 of the first pixel P1 in a circuit manner, and, thus, can be supplied with a current from the driving circuit DRC 1 of the first pixel P1.

Figure 6A:
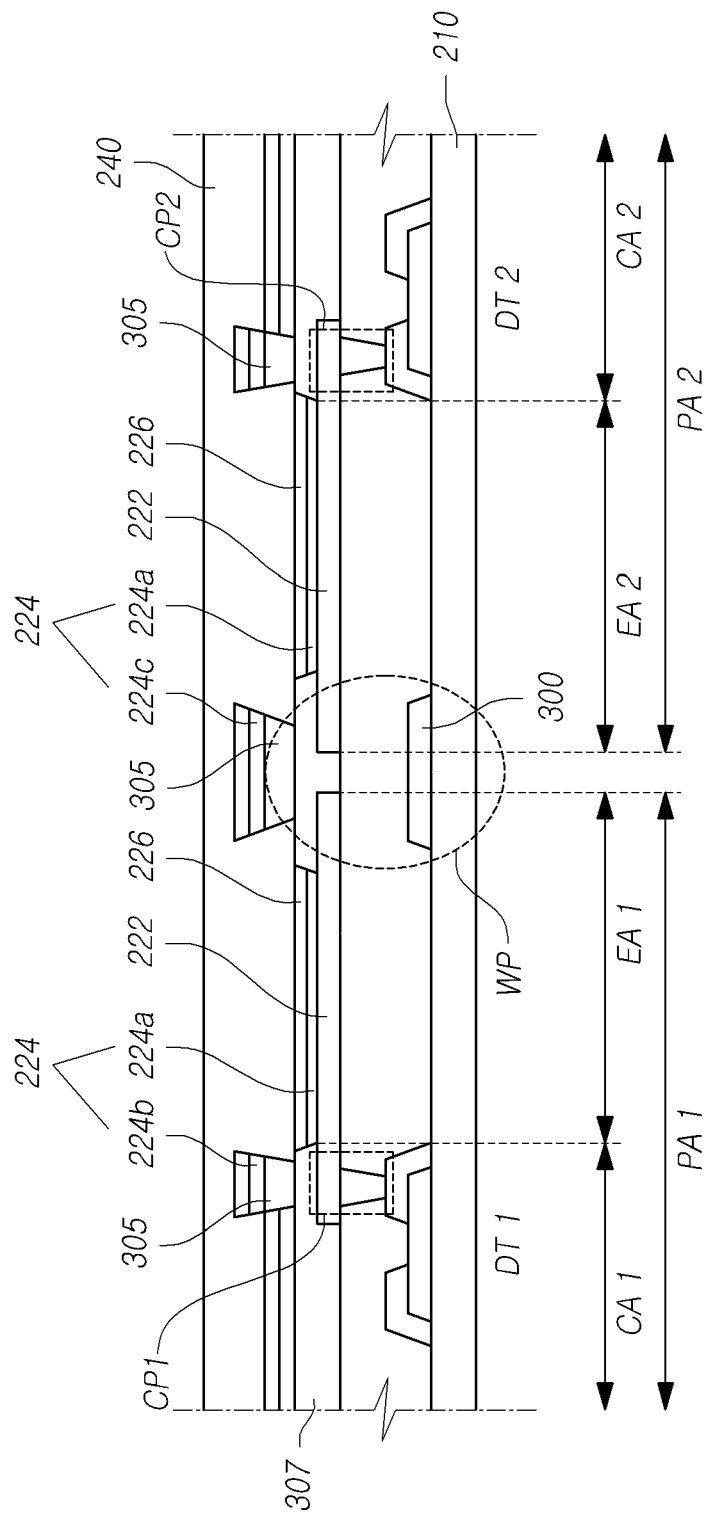

FIGS. 6A and 6B are cross-sectional views of the organic light emitting display device 100 including the repair structure illustrated in FIG. 5A.

Referring to FIG. 2 and FIG. 6A, the organic light emitting display device 100 includes the OLED 220 that emits a light in each emission area on the substrate 210. The OLED 220 may include the first electrode 222, the second electrode 226, and the organic layer 224 disposed between the first electrode 222 and the second electrode 226 in the emission area. The organic light emitting display device 100 may include the encapsulation layer 240 that seals the OLED 220.

The organic light emitting display device 100 includes a bank 307 that defines a boarder of an emission area and a structure 305 disposed on the bank 307. The bank 307 forms a boundary around an open area that defines the emission area. Generally, the bank 307 may not include an opened area in the circuit area or non-emission area. The first electrode 222 is disposed under the bank 307 in an open area of the bank 307. The first electrode 222 is exposed through the open area of the bank 307. The organic layer 224 is disposed on the bank 307, the structure 305, and the first electrode 222. In the organic layer 224, organic layers 224b and 224c disposed on the structure 305 are separated from another organic layer 224a. Herein, the term "separation" means complete physical separation and also means separation for thermal damage caused by a laser process not to be spread to another organic layer during a repair process or connection with a relatively small thickness as described below.

The structure 305 may have a reverse-tapered shape increased in size from the bank 307, but is not limited thereto. The structure 305 may have a plane structure formed into a plane shape or a ring shape (for example, a square ring shape), but is not limited thereto. Under the structure 305, various lines which are disconnected due to a circuit unit defect or are not disconnected due to no circuit unit defect may be disposed.

Under the structure 305, the floating pattern 300 insulated from the first electrode 222 may be disposed as illustrated in FIG. 6A. Otherwise, under the structure 305, the connection pattern 310 formed by laser-welding the floating pattern 300 and electrically connected to the first electrode 222 may be disposed as illustrated in FIG. 6B.

The floating pattern 300 may be formed on a gate layer, a source-drain layer, or another layer, or may be formed on two of the gate layer, the source-drain layer, and another layer. The floating pattern 300 may be formed of at least one of a gate material, a source-drain material, or another material.

Figure 7A:
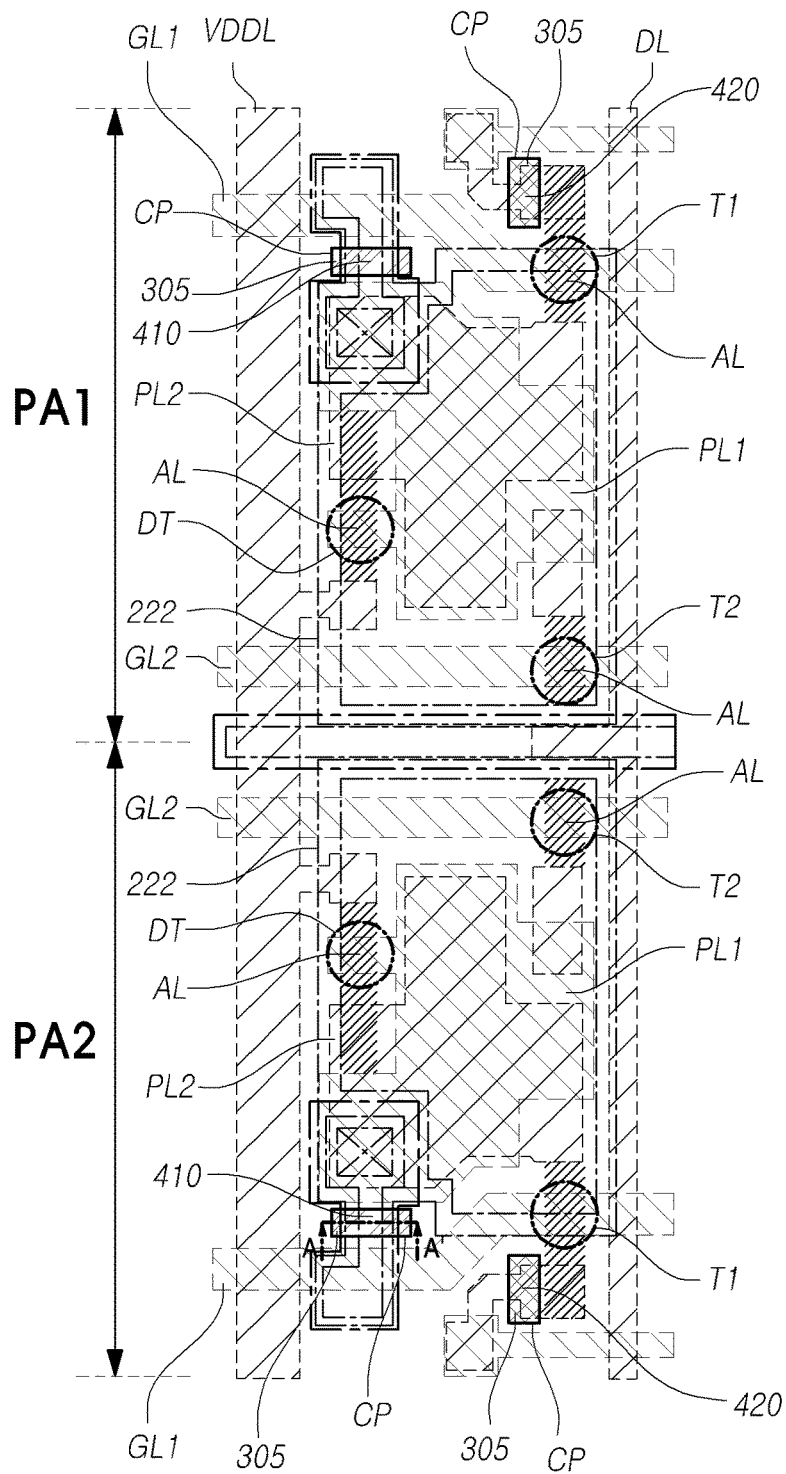
FIG. 7A is a plane view of an organic light emitting display device according to another embodiment of the present invention and including a pixel area PA 1 of a first pixel P1 and a pixel area PA 2 of a second pixel P2 illustrated in FIG. 5A.
Figure 7B:
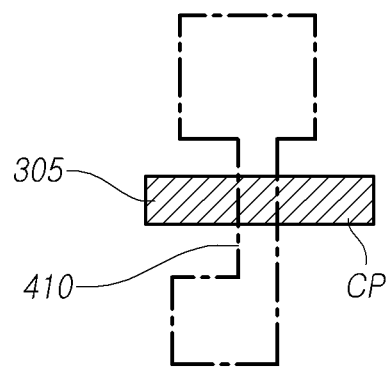
FIG. 7B and FIG. 7C are enlarged plane views of a structure and a first connection pattern illustrated in FIG. 7A.
Figure 7C:
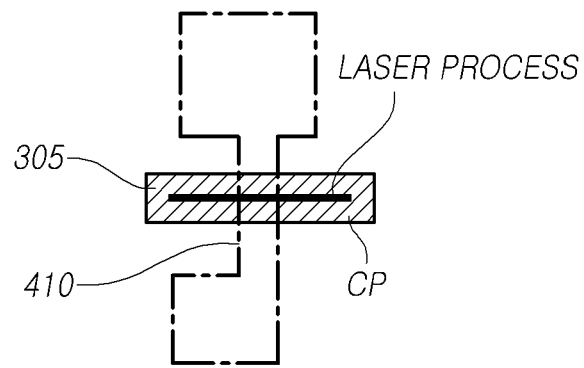

FIG. 7A is a plane view of an organic light emitting display device according to another embodiment of the present invention and including a pixel area PA 1 of a first pixel P1 and a pixel area PA 2 of a second pixel P2 illustrated in FIG. 5A. FIG. 7B and FIG. 7C are enlarged plane views of a structure and a first connection pattern illustrated in FIG. 7A.

Referring to FIG. 2 and FIG. 7A, in organic light emitting display devices 400 adjacent to each other according to another embodiment of the present invention, the pixel area PA 1 of the first pixel P1 and the pixel area PA 2 of the second pixel P2 are adjacent to each other, and the organic light emitting diode OLED 1 of the first pixel P1 and the organic light emitting diode OLED 2 of the second pixel P2 may be disposed to be adjacent to each other as illustrated in FIG. 5.

In the first pixel P1 and the second pixel P2, a high power voltage line VDDL and a data line DL are disposed in a first direction, for example, a longitudinal direction (longitudinal direction in FIG. 7A), and a first gate line GL1 and a second gate line GL2 may be disposed in a second direction, for example, a transverse direction.

In a laminated structure, first and second plates PL1 and PL2 constituting the storage capacitor Cstg of the emission area EA in each of the first pixel P1 and the second pixel P2 are disposed. The first electrode 222 is disposed thereon. The second gate line GL2 is disposed between the first plate PL1 and the data line DL and a semiconductor layer (or an active layer AL) is disposed on the second gate line GL2, so that the switching transistor T2 is formed. The first gate line GL1 is disposed between the second plate PL2 and a reference voltage line RVL, and a semiconductor layer AL is disposed on the first gate line GL1, so that the sensing transistor T1 is formed. A semiconductor layer AL is disposed between the high power voltage line VDDL and the second plate PL2, so that the driving transistor DT is formed.

Although not illustrated in FIG. 7A, the organic layer 224 and the second electrode 226 are disposed in sequence on the first electrode 222 as illustrated in FIG. 6A and FIG. 6B, so that the first electrode 222, the second electrode 226, and the organic layer 224 between them constitute the OLED 220.

A line located at the cutting point CP illustrated in FIG. 6A and FIG. 6B may be a first connection pattern 410 that electrically connects the driving transistor DT and the first electrode 222 of the OLED or a second connection pattern 420 located between the driving transistor DT and the reference voltage line RVL that applies a reference voltage to a source/drain of the driving transistor DT, but is not limited thereto. It may be easy to perform a disconnection process with laser to the first connection pattern 410 and the second connection pattern 420 in a circuit structure. For example, if the line located at the cutting point CP is the first connection pattern 410 illustrated in FIG. 7B, a disconnection process may be performed with laser to the first connection pattern 410 located at the cutting point CP as illustrated in FIG. 7C.

Figure 8A:
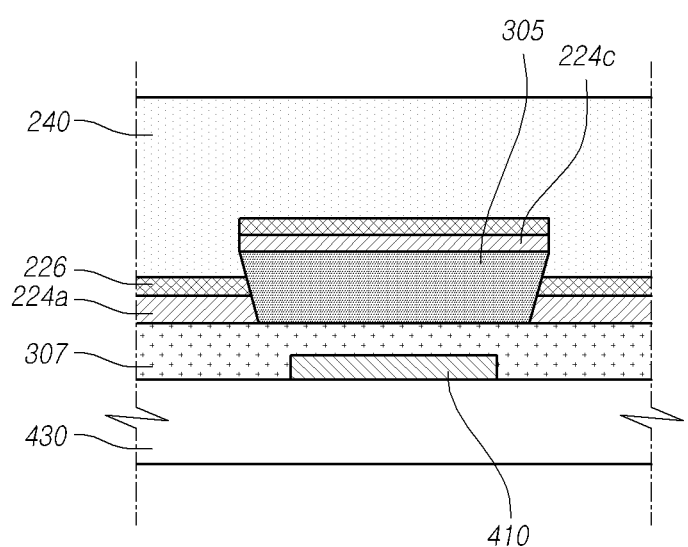
FIGS. 8A and 8B are cross-sectional views taken along a line AA' of FIG. 7A before and after laser cutting as one example.
Figure 8B:
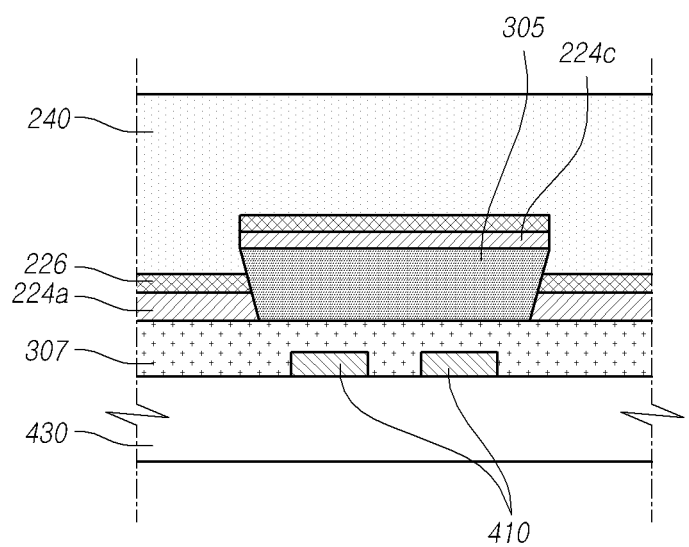
Figure 9:
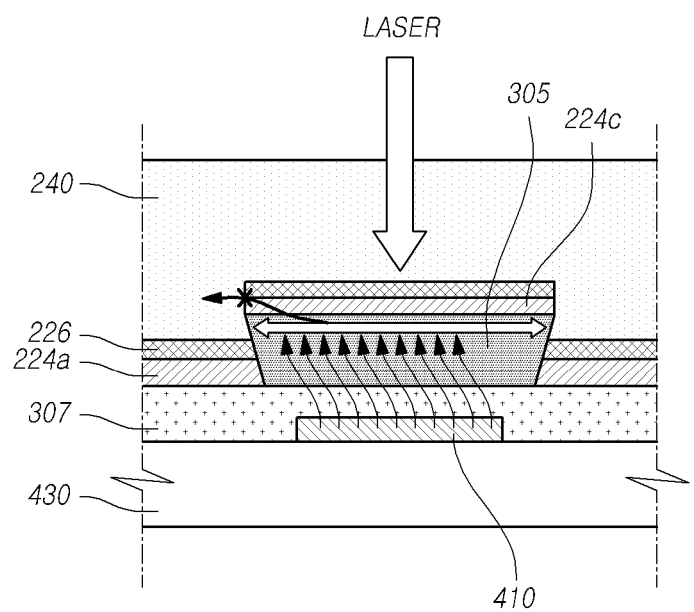
FIG. 9 is a diagram illustrating a process of a laser treatment to a cutting point illustrated in FIG. 8A.

FIGS. 8A and 8B are cross-sectional views taken along a line AA' of FIG. 7A before and after laser cutting as one example. FIG. 9 is a view provided to explain a process of a laser treatment to a cutting point illustrated in FIG. 8A.

Referring to FIG. 8A, the structure 305 is disposed at the cutting point CP. The structure 305 is located at the cutting point CP on the first connection pattern 410 and the bank 307. The structure 305 may have a reverse-tapered shape in which an upper portion is wider than a lower portion, but is not limited thereto. The structure 305 has a parallelogram cross section as illustrated in FIG. 8A and may have a reverse-tapered side surface formed into an approximately linear shape, which can be formed during a manufacturing process, rather than a completely linear shape.

The organic layer 224 including the bank 307 and the structure 305 may be disposed on the entire surface of the display panel 110. The organic layer 224 is divided into the organic layer 224a formed on any area except the structure 305 and the organic layer 224c formed on the structure 305. Since the structure 305 has a reverse-tapered shape, if the organic layer 224 is formed on the entire surface of the display panel 110 without a separate process, the organic layer 224 can be divided into the two organic layers 224a and 224c without any additional process.

Since the organic layer 224 is divided into the two organic layers 224a and 224b by the structure 305 at the cutting point CP, even if a laser is irradiated toward the first connection pattern 410 from above the second electrode 226, the organic layer 224c, and the structure 305, spread of thermal damage through the neighboring organic layer 224 can be suppressed as illustrated in FIG. 9. If a laser is irradiated from a direction of the first connection pattern 410 as illustrated in FIG. 8B, the first connection pattern 410 is laser-cut.

Figure 10:
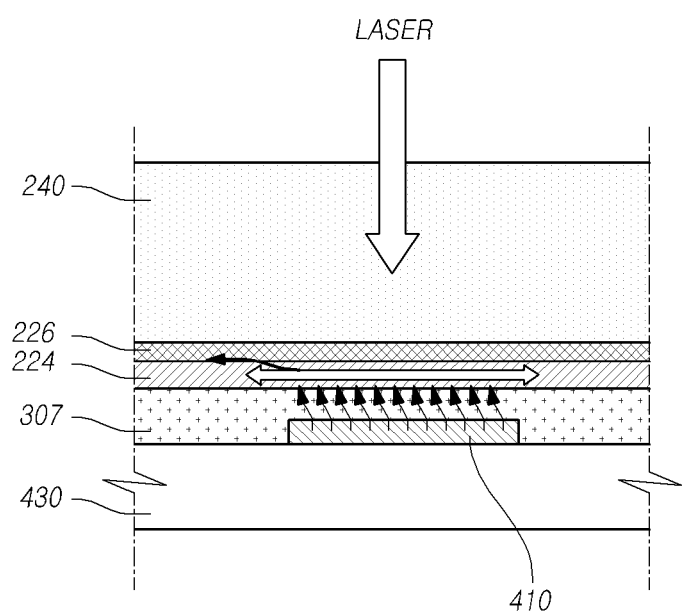
FIG. 10 is a cross-sectional view of an organic light emitting display device according to a comparative example.

FIG. 10 is a cross-sectional view of an organic light emitting display device according to a comparative example.

Referring to FIG. 10, in an organic light emitting display device 400A according to the comparative example, if the lines located at the cutting point CP is the first connection pattern 410 that electrically connects the driving transistor DT and the first electrode 222 of the organic light emitting diode OLED, the first connection pattern 410 may be located on an insulation layer 430. The bank 307 may be disposed on the first connection pattern 410. The organic layer 224, the second electrode 226, and the encapsulation layer 240 may be located on the bank 307.

In this case, the organic layer 224 may be a common layer on the entire display panel rather than two or more separate layers as being disposed in the organic light emitting display device 400 according to another embodiment of the present invention described with reference to FIG. 8A and FIG. 8B.

In case of applying a laser repair process to the organic light emitting display device 400A according to the comparative example, a laser is irradiated from a direction of the organic layer 224, the second electrode 226, and the encapsulation layer 240 disposed on the first connection pattern 410. In this case, during a disconnection process, thermal damage may be spread through the organic layer 224 having the lowest pyrolysis temperature from a specific location of the organic layer 224 where the laser is irradiated to an adjacent location. As a result, heat may be spread to the organic layer 224 during a disconnection process, so that a thermal damage area of the organic layer 224 may be increased.

Figure 11A:
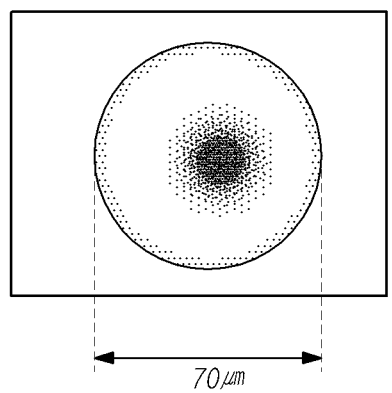
FIGS. 11A and 11B are views provided to explain a thermal damage spread phenomenon in an organic layer of the organic light emitting display device according to the comparative example illustrated in FIG. 10.
Figure 11B:
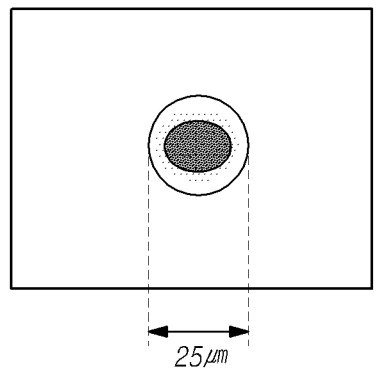

In order to experimentally check an increase of a thermal damage area, a size of a thermal damage area in a case where a laser is irradiated from a direction of the organic layer 224, the second electrode 226, and the encapsulation layer 240 disposed on the first connection pattern 410 in a top-emission organic light emitting display device in which the organic layer 224 is experimentally formed was measured. Further, a size of a thermal damage area in a case where a laser is irradiated from a direction of the second electrode 226 and the encapsulation layer 240 disposed on the first connection pattern 410 in a top-emission organic light emitting display device in which the organic layer 224 is not formed was measured. In the former case as illustrated in FIG. 11A, the size of the thermal damage area is 60 μm or more, for example, 70 μm. In the latter case as illustrated in FIG. 11B, the size of the thermal damage area is 25 μm.

Aa described above, if a laser is irradiated from a direction of the organic layer 224, the second electrode 226, and the encapsulation layer 240 disposed on the first connection pattern 410 in the top-emission organic light emitting display device in which the organic layer 224 is formed, thermal damage may be spread to an adjacent pixel area and an adjacent pixel located in the adjacent pixel area may not emit a light (non-emission of the adjacent pixel), as illustrated in FIG. 11C.

In the above-described another embodiment of the present invention, the structure 305 has been described as having a plane structure formed into a plane shape on the entire area of the cutting point CP. However, the structure 305 may have a ring shape, for example, a square ring shape, on a partial area of the cutting point CP as illustrate in FIG. 12 through FIG. 14.

Figure 12:
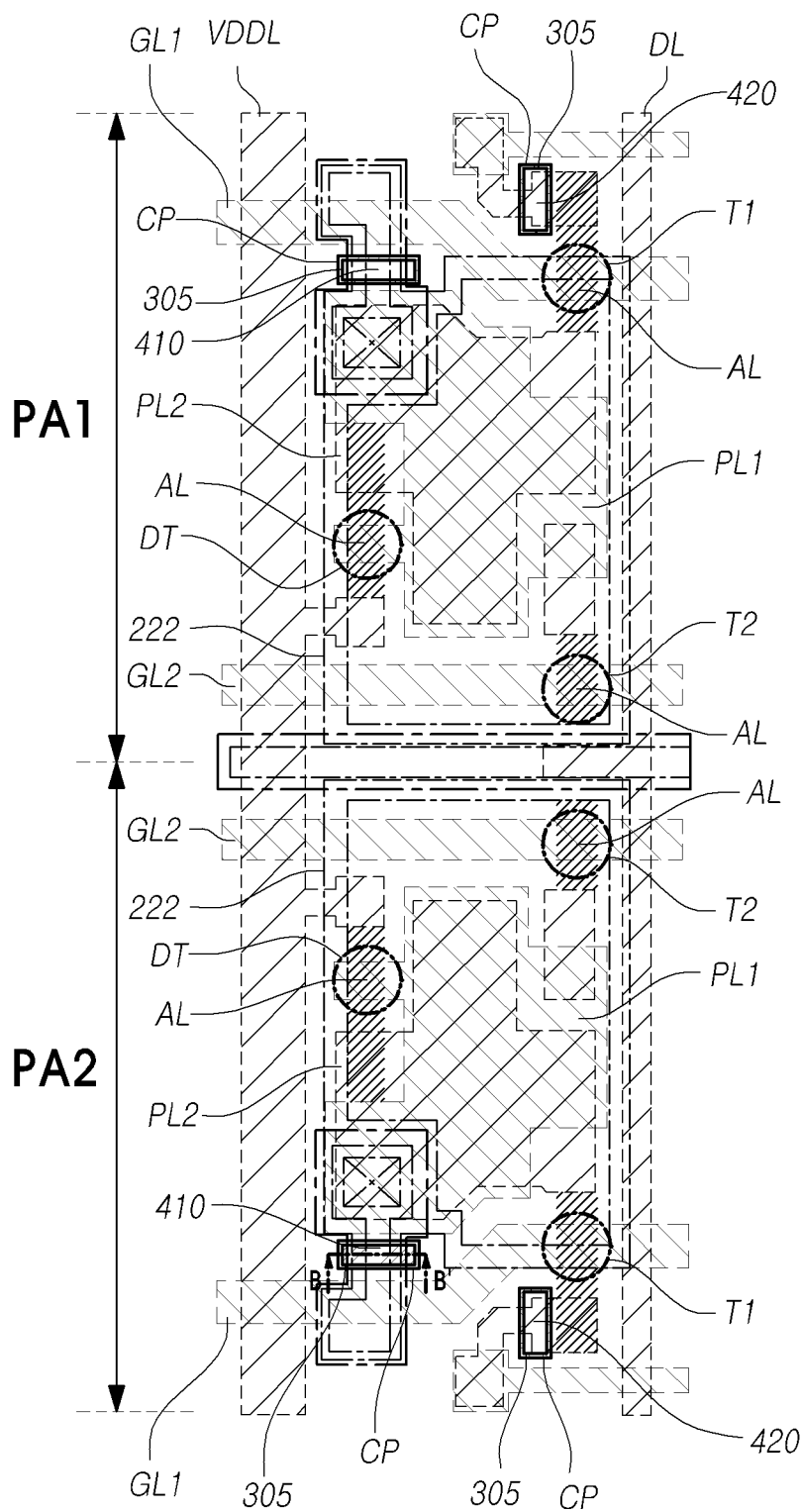
FIG. 12 is a plane view of an organic light emitting display device according to yet another embodiment of the present invention.
Figure 13A:
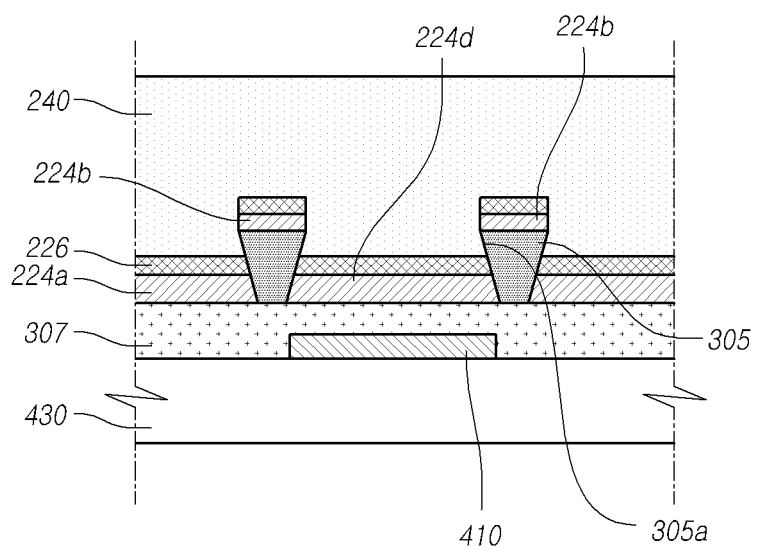
FIGS. 13A and 13B are cross-sectional views taken along a line BB' of FIG. 12 before and after laser cutting as one example.
Figure 13B:
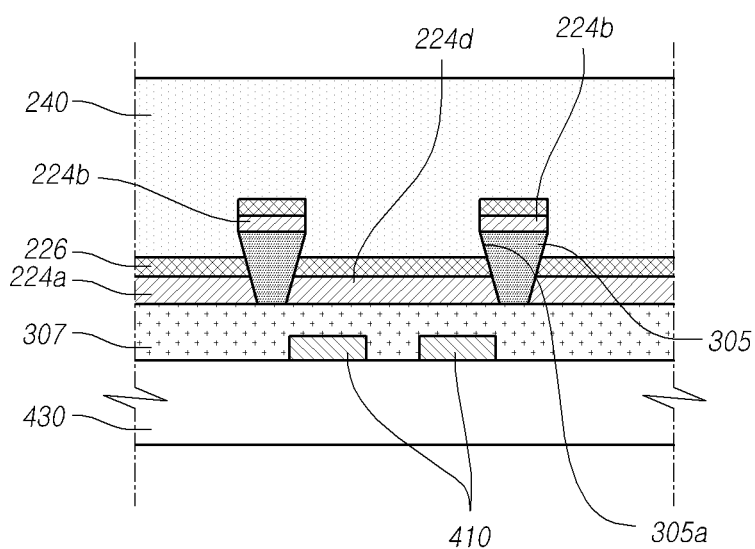

FIG. 13A and FIG. 13B are cross-sectional views taken along a line BB' of FIG. 12 before and after laser cutting as one example.

As illustrated in FIG. 13A and FIG. 13B, the ring-shaped structure 305 may have a reverse-tapered shape in which an upper portion is wider than a lower portion, but is not limited thereto.

In an organic light emitting display device according to yet another embodiment of the present invention, the organic layer 224 is divided into the organic layer 224a located outside the structure 305, the organic layer 224b formed on the structure 305, and an organic layer 224d located inside the structure 305, i.e., in a well 305a of the ring-shaped structure 305. In other words, the organic layer 224d located in the well 305a of the ring-shaped structure 305 is surrounded by the ring-shaped structure 305 and structurally separated from the organic layer 224a located outside the structure 305. Since the structure 305 has a reverse-tapered shape, if the organic layer 224 is formed on the entire surface of the display panel 110 without a separate process, the organic layer 224 can be divided into the three organic layers 224a, 224b, and 224d without any additional process.

Figure 14:
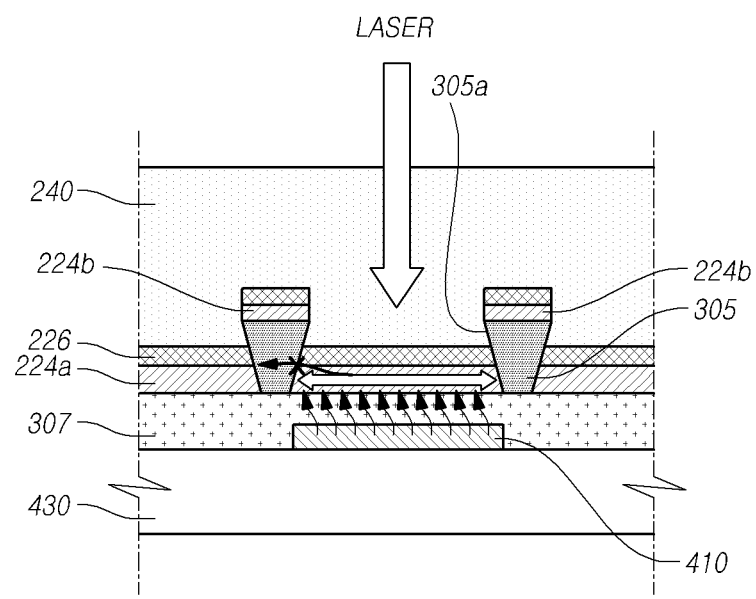
FIG. 14 is a view illustrating a process of a laser treatment to a cutting point illustrated in FIG. 13.

Since the organic layer 224 is divided into the three organic layers 224a, 224b, and 224d by the structure 305 at the cutting point CP, even if a laser is irradiated onto the first connection pattern 410 from a direction of the second electrode 226, the organic layer 224d located in the well 305a of the structure 305, and the structure 305, the structure 305 shields heat and suppresses spread of thermal damage to the neighboring organic layer 224a located outside the structure 305 as illustrated in FIG. 14. If a laser is irradiated from a direction of the first connection pattern 410 as illustrated in FIG. 13B, the first connection pattern 410 is laser-cut.

As described above, the structure 305 is disposed at the cutting point CP. Thus, when a laser is irradiated for repair, the structure 305 can suppress spread of thermal damage to the neighboring organic layer 224a. Meanwhile, the cutting point CP has been described as the first connection pattern 410, but may be the second connection pattern 420 and another line or connection pattern. Even in this case, the structure 305 illustrated with reference to FIG. 8A through FIG. 14 is disposed at the cutting point CP. Thus, when a laser is irradiated for repair, the structure 305 can suppress spread of thermal damage to the neighboring organic layer 224a.

Aside from the cutting point CP, a location to which a laser is irradiated to suppress spread of thermal damage to a neighboring organic layer in case of irradiating the laser to the organic layer 224 separated from other portions may be the welding point WP at which the floating pattern 300 or the connection pattern 310 illustrated in FIG. 5A through FIG. 6B is located.

Under the structure 305, the floating pattern 300 insulated from the first electrode 222 or the connection pattern 310 formed by laser-welding the floating pattern 300 and electrically connected to the first electrode 222 may be disposed.

Figure 15A:
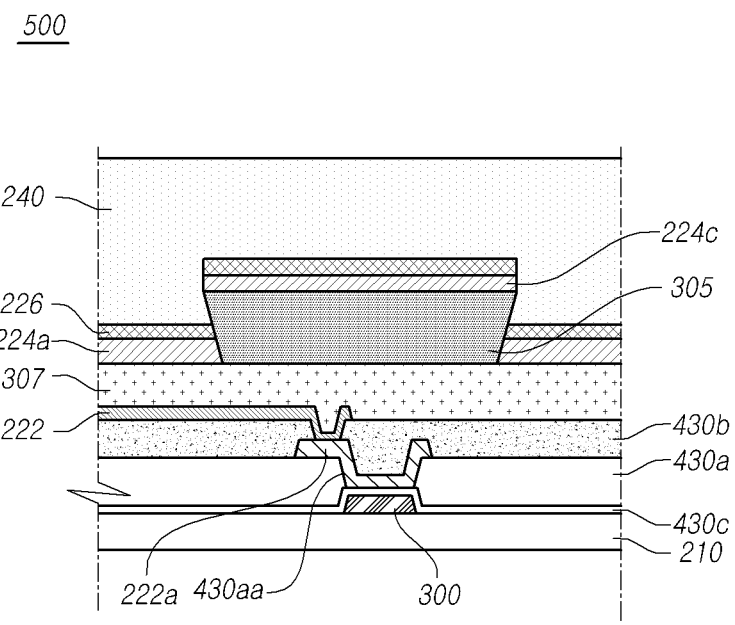
FIGS. 15A and 15B are cross-sectional views of a welding point WP of an organic light emitting display device according to still another embodiment of the present invention before and after welding.
Figure 15B:
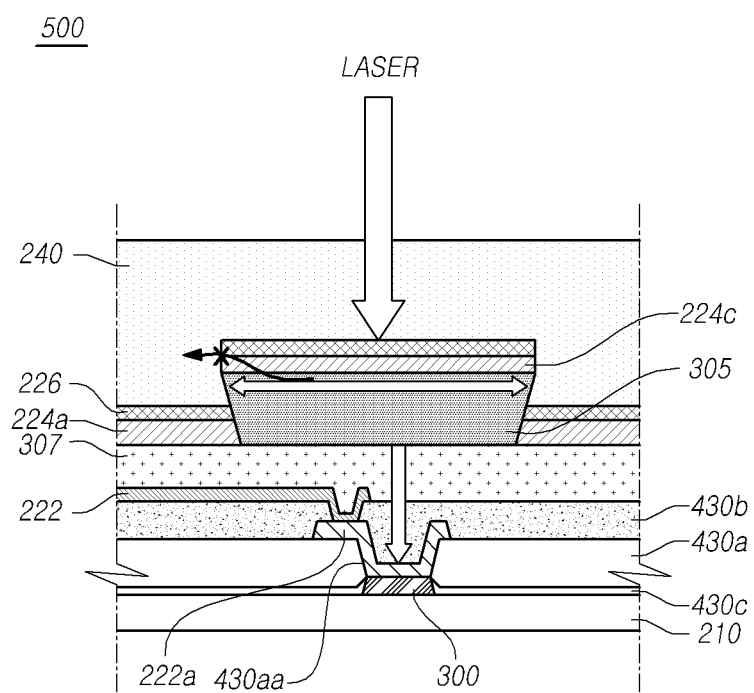

FIGS. 15A and 15B are cross-sectional views of a welding point WP of an organic light emitting display device according to still another embodiment of the present invention before and after welding.

Referring to FIG. 15A, an organic light emitting display device 500 according to still another embodiment of the present invention includes the floating pattern 300 located at the welding point WP on the substrate 210, first to third insulation layers 430a, 430b, and 430c, and an auxiliary line 222a of which a part is disposed on the second insulation layer 430b and another other part is disposed on the third insulation layer 430c through a contact hole 430aa of the first insulation layer 430a. The auxiliary line 222a is electrically connected to the first electrode 222.

The first electrode 220, the bank 307 including the open area through which the first electrode 220 is exposed, the organic layer 224 disposed on the bank 307, the structure 305, and the first electrode 222, the second electrode 226 disposed on the organic layer 224, and the encapsulation layer 240 disposed on the second electrode 226 as illustrated above with reference to FIG. 6 may be included in the same manner as described with reference to FIG. 6.

Herein, the organic layer 224 is divided into the organic layer 224a formed on any area except the structure 305 and the organic layer 224c formed on the structure 305. Since the structure 305 has a reverse-tapered shape, if the organic layer 224 is formed on the entire surface of the display panel 110 without a separate process, the organic layer 224 can be divided into the two organic layers 224a and 224c without any additional process.

In this case, the floating pattern 300 is extended to an adjacent pixel and a laser is irradiated to the auxiliary line 222a electrically connected to the first electrode 222 located in each pixel, so that the auxiliary line 222a is connected to the floating pattern 300 through the third insulation layer 430. Thus, the auxiliary line 222a and the floating pattern 300 which are laser-welded as illustrated in FIG. 15B may function as the connection pattern 310 illustrated in FIG. 6B.

In this case, the floating pattern 300 may be formed of a source-drain material on a gate layer. However, as described above, the floating pattern 300 may be located on the gate layer or a source-drain layer, or may be located on both of the gate layer and the source-drain layer. The floating pattern 300 may be formed of at least one of a gate material, a source-drain material, or another material.

Since the organic layer 224 is divided into the two organic layers 224a and 224c by the structure 305 at the welding point WP, even if a laser is irradiated toward the auxiliary line 222a and the floating pattern 300 from above the second electrode 226, the organic layer 224c, and the structure 305, spread of thermal damage through the neighboring organic layer 224 can be suppressed as illustrated in FIG. 15B.

Figure 16A:
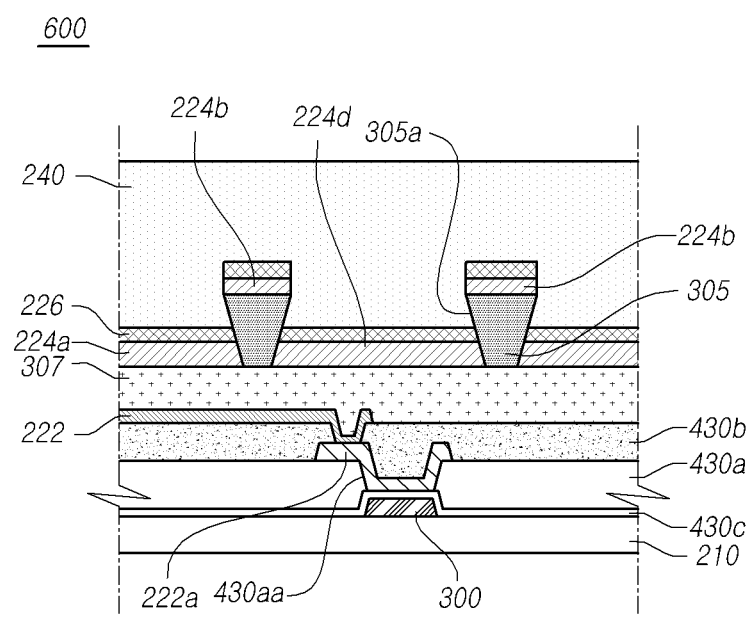
FIGS. 16A and 16B are cross-sectional views of a welding point WP of an organic light emitting display device according to still another embodiment of the present invention before and after welding.
Figure 16B:
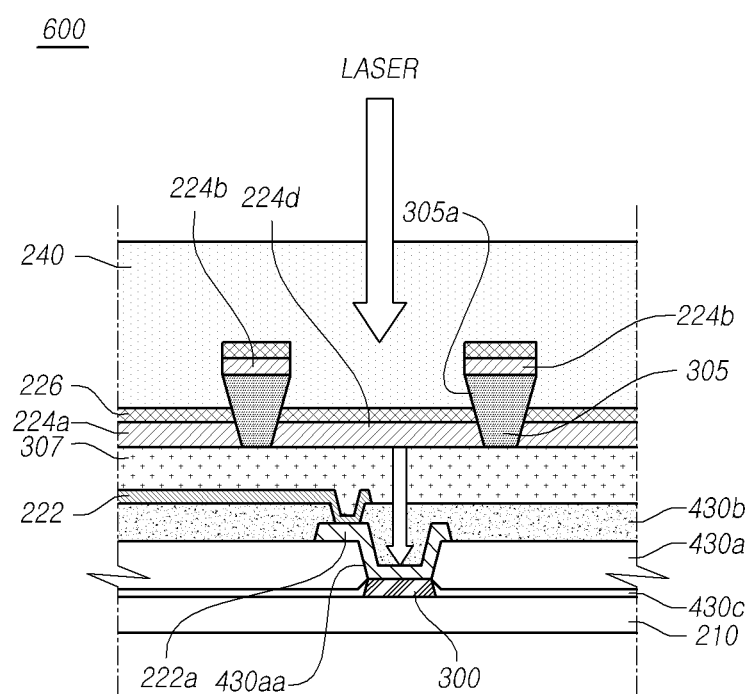

FIGS. 16A and 16B are cross-sectional views of a welding point WP of an organic light emitting display device according to still another embodiment of the present invention before and after welding.

In the above-described still another embodiment of the present invention, the structure 305 having a plane structure formed into a plane shape has been described as being disposed on the entire area of the welding point WP. However, the structure 305 may have a ring shape on a partial area of the welding point WP of organic light emitting display device 600 as illustrate in FIG. 16A and FIG. 16B. The ring-shaped structure 305 has a reverse-tapered shape in which an upper portion is wider than a lower portion as illustrated in FIG. 16A and FIG. 16B.

The organic layer 224 is divided into the organic layer 224a located outside the structure 305, i.e., in a well of the ring-shaped structure 305, the organic layer 224b formed on the structure 305, and the organic layer 224d located inside the structure 305. Since the structure 305 has a reverse-tapered shape, if the organic layer 224 is formed on the entire surface of the display panel, the organic layer 224 can be divided into the three organic layers 224a, 224b, and 224d without any additional process.

Since the organic layer 224 is divided into the three organic layers 224a, 224b, and 224d by the structure 305 at the welding point WP, even if a laser is irradiated onto the floating pattern 300 from a direction of the organic layer 224d located inside the structure 305, the structure 305 shields heat and suppresses spread of thermal damage to the neighboring organic layer 224a located outside the structure 305 as illustrated in FIG. 13.

Referring to each of FIG. 8A through FIG. 9 and FIG. 12 through FIG. 14, the first connection pattern 410 has been illustrated as being at the cutting point CP and the reverse-tapered structure 305 has been described as being on the bank 307. However, as described below, the bank 307 may have an open area, so that the first connection pattern 410 may be exposed to the outside, and the reverse-tapered structure 305 may be disposed around the first connection pattern 410 or directly on the first connection pattern 410.

Figure 17A:
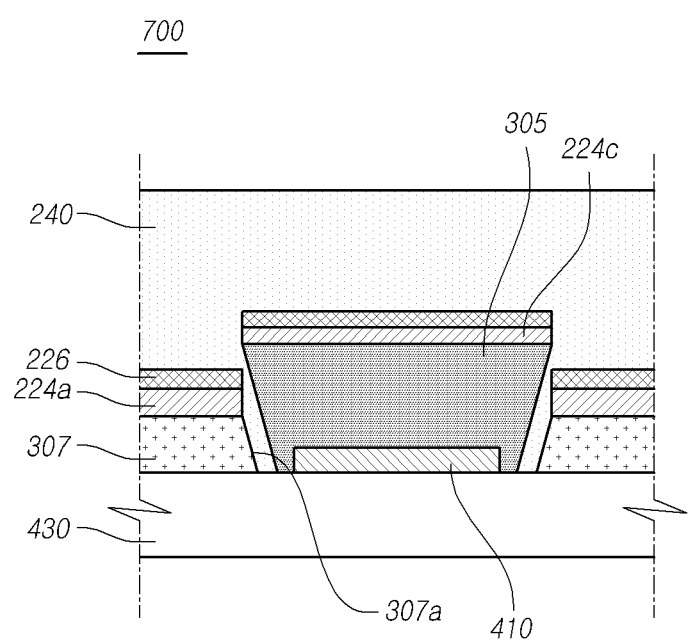
FIGS. 17A and 17B are cross-sectional views taken along the line AA' of FIG. 7A before and after laser cutting as another example.
Figure 17B:
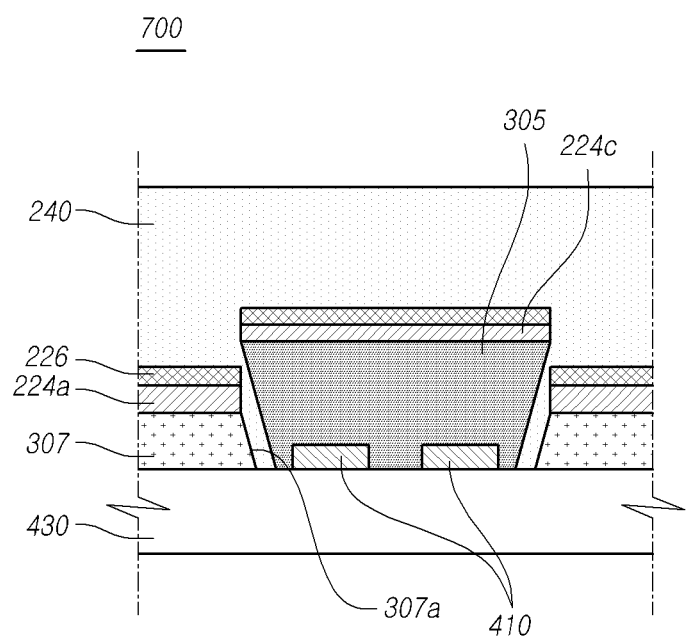

FIGS. 17A and 17B are cross-sectional views taken along the line AA' of FIG. 7A before and after laser cutting as another example.

Referring to FIG. 17A, an organic light emitting display device 700 according to still another embodiment of the present invention includes the insulation layer 430, the bank 307 located on the insulation layer 430 and configured to define a boarder of an emission area, the structure 305 located on the insulation layer 430, a first electrode (not illustrated) located in the emission area of the bank 307, the organic layer 224 located on the bank 307, the structure 305, and the first electrode, and the second electrode 226 located on the organic layer 224.

The reverse-tapered structure 305 is disposed at the cutting point CP. In this case, the structure 305 may have a plane structure formed into a plane shape. The bank 307 includes an open portion 307a opened at the cutting point CP. Since the bank 307 is opened, the first connection pattern 410 is exposed to the outside of the bank 307 through the open portion 307a of the bank 307. The cutting point CP is located in the circuit area or the non-emission area, and the bank 307 at the cutting point CP includes the open portion 307a. The structure 305 is located at the open portion 307a on the insulation layer 430. The structure 305 is located directly on the first connection pattern 410.

The bank 307 may be a typical transparent bank, or may be a black bank including a black material. Herein, the black material may use any black resin, and may use one of black resin formed of a photosensitive organic insulating material having a low dielectric constant, graphite powder, gravure ink, black spray, and black enamel. Particularly, if the black bank is applied, the bank 307 is opened and the first connection pattern 410 under the structure 305 is seen during a laser cutting process. Thus, the first connection pattern 410 can be laser-cut.

The organic layer 224 including the bank 307 and the structure 305 may be located on the entire surface of the display panel 110. The organic layer 224 is divided into the organic layer 224a formed on any area except the structure 305 and the organic layer 224c formed on the structure 305. Since the structure 305 has a reverse-tapered shape, if the organic layer 224 is formed on the entire surface of the display panel 110 without a separate process, the organic layer 224 can be divided into the two organic layers 224a and 224c without any additional process.

Since the organic layer 224 is divided into the two organic layers 224a and 224c by the structure 305 at the cutting point CP, even if a laser is irradiated toward the first connection pattern 410 from above the second electrode 226, the organic layer 224c, and the structure 305, spread of thermal damage through the neighboring organic layer 224 can be suppressed. If a laser is irradiated from a direction of the first connection pattern 410 as illustrated in FIG. 12B, the first connection pattern 410 is laser-cut. Therefore, a line such as the first connection pattern 410 which is disconnected or not disconnected by the cutting point CP may be located under the structure 305.

Figure 18A:
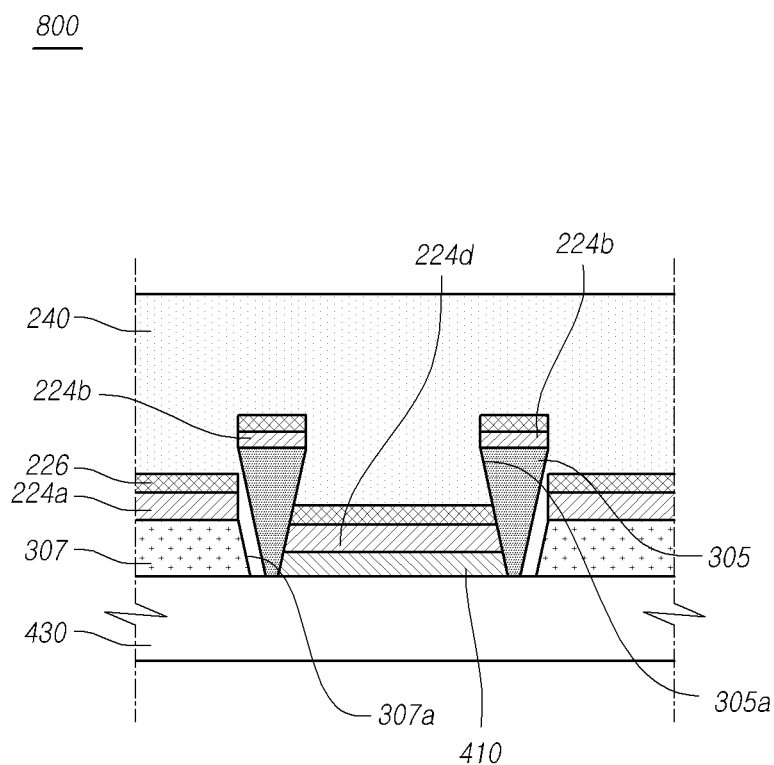
FIG. 18A and FIG. 18B are cross-sectional views taken along the line BB' of FIG. 12 before and after laser cutting as another example.
Figure 18B:
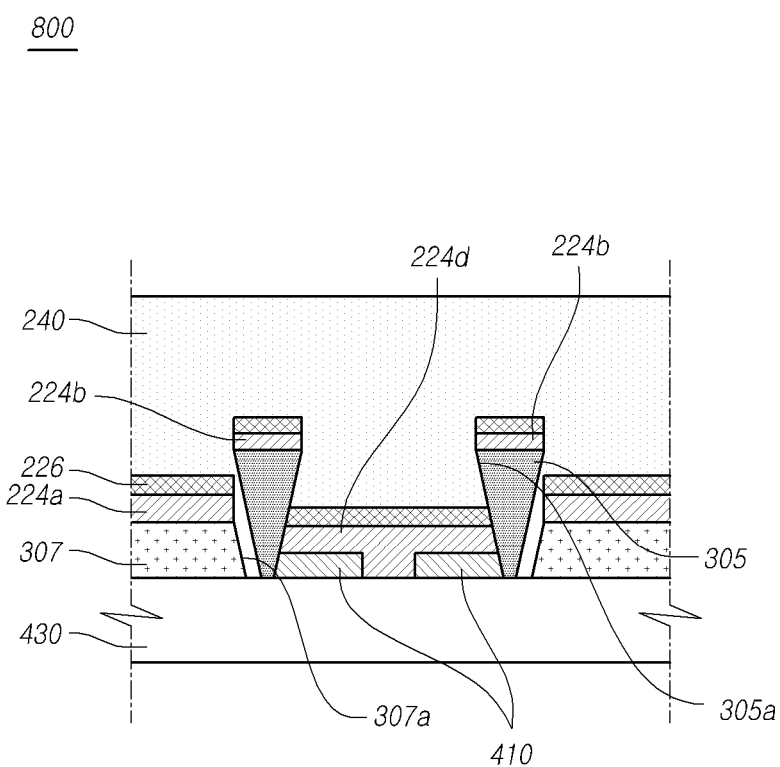

FIG. 18A and FIG. 18B are cross-sectional views taken along the line BB' of FIG. 12 before and after laser cutting as another example.

Referring to FIG. 18A, an organic light emitting display device 800 according to still another embodiment of the present invention is substantially the same as the organic light emitting display device 700 according to still another embodiment of the present invention described with reference to FIG. 17A.

The reverse-tapered ring-shaped structure 305 is disposed at the cutting point CP. The bank 307 includes the open portion 307a opened at the cutting point CP. Since the bank 307 is opened, the first connection pattern 410 is exposed to the outside of the bank 307 through the open portion 307a of the bank 307. The structure 305 is located at the open portion 307a on the insulation layer 430. The ring-shaped structure 305 may be located around the first connection pattern 410, or may be located directly on the first connection pattern 410 or on a part of the first connection pattern 410 and a part of the insulation layer 430.

As described above, the bank 307 may be a typical transparent bank, or may be a black bank including a black material. As described above, if the black bank is applied, the bank 307 is opened and the first connection pattern 410 under the structure 305 is seen during a laser cutting process. Thus, the first connection pattern 410 can be laser-cut.

In an organic light emitting display device according to still another embodiment of the present invention, the organic layer 224 is divided into the organic layer 224a located outside the structure 305, the organic layer 224b formed on the structure 305, and the organic layer 224d located inside the structure 305, i.e., in the well 305a of the ring-shaped structure 305. In other words, the organic layer 224d located in the well 305a of the ring-shaped structure 305 is surrounded by the ring-shaped structure 305 and structurally separated from the organic layer 224a located outside the structure 305. Since the structure 305 has a reverse-tapered shape, if the organic layer 224 is formed on the entire surface of the display panel without a separate process, the organic layer 224 can be divided into the three organic layers 224a, 224b, and 224d without any additional process.

Since the organic layer 224 is divided into the three organic layers 224a, 224b, and 224d by the structure 305 at the cutting point CP, even if a laser is irradiated onto the first connection pattern 410 from a direction of the second electrode 226, the organic layer 224d located in the well 305a of the structure 305, and the structure 305, the structure 305 shields heat and suppresses spread of thermal damage to the neighboring organic layer 224a located outside the structure 305. If a laser is irradiated from a direction of the first connection pattern 410 as illustrated in FIG. 18B, the first connection pattern 410 is laser-cut. As described above with reference to FIG. 17A through FIG. 18B, since the bank 307 is opened, the first connection pattern 410 is exposed to the outside. Further, since the reverse-tapered structure 305 is disposed around the first connection pattern 410 or directly on the first connection pattern 410 at the cutting point CP, when a laser is irradiated for repair, the structure 305 can suppress spread of thermal damage to the neighboring organic layer 224a.

Similarly, the bank 307 is opened and the first connection pattern 410 is thus exposed to the outside, and the reverse-tapered structure 305 is disposed around the first connection pattern 410 or directly on the first connection pattern 410 at the welding point WP described with reference to FIG. 15A through FIG. 16B. Thus, when a laser is irradiated for repair, the structure 305 can suppress spread of thermal damage to the neighboring organic layer 224a. In other words, under the structure 305, the floating pattern insulated from the first electrode or the connection pattern formed by laser-welding the floating pattern and electrically connected to the first electrode may be disposed. As described above, the floating pattern may be located on a gate layer or a source-drain layer, or may be located on both of the gate layer and the source-drain layer. The floating pattern may be formed of at least one of a gate material or a source-drain material.

As described above, the bank 307 may be a typical transparent bank, or may be a black bank including a black material. As described above, if the black bank is applied, the bank 307 is opened and the first connection pattern 410 under the structure 305 is seen during a laser cutting process. Thus, the first connection pattern 410 can be laser-cut.

As described above, according to an embodiment of the present invention, it is possible to provide an organic light emitting display device including a repair structure capable of repairing a circuit unit defect as one factor of a pixel defect and also possible to provide an organic light emitting display device in which a circuit unit defect is repaired.

Further, according to an embodiment of the present invention, it is possible to provide an organic light emitting display device in which thermal damage is not spread to an organic layer during a repair process, and, thus, non-emission or bonding of adjacent pixels caused by the thermal damage during the repair process can be suppressed.

Furthermore, according to an embodiment of the present invention, it is possible to provide an organic light emitting display device to which the above-described repair process can be performed even if a black bank is applied.

The foregoing description and the accompanying drawings are provided only to illustrate the technical conception of the present disclosure, but it will be understood by a person having ordinary skill in the art that various modifications and changes such as combinations, separations, substitutions, and alterations of the components may be made without departing from the scope of the present disclosure. Therefore, the embodiments of the present invention are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device comprising:
a bank defining a border of an emission area;
a structure disposed on the bank;
a first electrode disposed in the emission area;
an organic layer disposed on the bank, the structure, and the first electrode, a height of the structure being such that the organic layer disposed on the structure is separated from the organic layers disposed on the bank and the first electrode;
a second electrode disposed on the organic layer; and
a first connection pattern disposed under the structure,
wherein the first connection pattern includes a gap under the structure.

2. The organic light emitting display device according to claim 1, wherein the structure has a reverse-tapered shape from the bank.

3. The organic light emitting display device according to claim 1, wherein the structure has a plane structure formed into a plane shape or a ring shape.

4. The organic light emitting display device according to claim 1, wherein a cutting point in which an electrical connection line is disconnected is located under the structure.

5. The organic light emitting display device according to claim 1, wherein a cutting point in which an electrical connection line is not to be disconnected is located under the structure.

6. The organic light emitting display device according to claim 5, further comprising:
a transistor disposed on a non-emission area to receive a high power voltage through a high power voltage line and supply a driving current to the first electrode, the organic layer, and the second electrode depending on a data voltage, under the organic layer,
wherein the line is a first connection pattern that electrically connects the transistor and the first electrode or a second connection pattern located between the transistor and a reference voltage line that applies a reference voltage to a source/drain of the transistor.

7. The organic light emitting display device according to claim 1, wherein a floating pattern insulated from the first electrode or a connection pattern formed by laser-welding the floating pattern and electrically connected to the first electrode is disposed under the structure.

8. The organic light emitting display device according to claim 7, wherein the floating pattern is located on a gate layer or a source-drain layer, or located on both of the gate layer and the source-drain layer.

9. The organic light emitting display device according to claim 7, wherein the floating pattern is formed of at least one of a gate material or a source-drain material.

10. An organic light emitting display device comprising:
an insulation layer;
a bank disposed on the insulation layer and defining a border of an emission area;
a structure disposed on the insulation layer;
a first electrode disposed in the emission area;
an organic layer disposed on the bank, the structure, and the first electrode, a height of the structure being such that the organic layer disposed on the structure is separated from the organic layers disposed on the bank and the first electrode;
a second electrode disposed on the organic layer; and
a first connection pattern disposed under the structure, wherein the first connection pattern includes a gap under the structure.

11. The organic light emitting display device according to claim 10, wherein the bank further includes an open portion, and the structure is located at the open portion on the insulation layer.

12. The organic light emitting display device according to claim 11, wherein the structure has a plane structure formed into a plane shape or a ring shape.

13. The organic light emitting display device according to claim 11, wherein a cutting point in which an electrical connection line is disconnected is located under the structure.

14. The organic light emitting display device according to claim 11, wherein a cutting point in which an electrical connection line is to be disconnected is located under the structure.

15. The organic light emitting display device according to claim 12, wherein a floating pattern insulated from the first electrode or a connection pattern formed by laser-welding the floating pattern and electrically connected to the first electrode is disposed under the structure.

16. The organic light emitting display device according to claim 12, wherein the bank is a black bank.

17. The organic light emitting display device according to claim 11, wherein the structure has a reverse-tapered shape from the bank.

18. The organic light emitting display device according to claim 14, further comprising:
a transistor disposed on a non-emission area to receive a high power voltage through a high power voltage line and supply a driving current to the first electrode, the organic layer, and the second electrode depending on a data voltage, under the organic layer,
wherein the electrical connection line is a first connection pattern that electrically connects the transistor and the first electrode or a second connection pattern located between the transistor and a reference voltage line that applies a reference voltage to a source/drain of the transistor.

* * * * *